United States Patent
Li et al.

(10) Patent No.: US 12,489,005 B2
(45) Date of Patent: Dec. 2, 2025

(54) TEMPERATURE-BASED METROLOGY CALIBRATION AT A MANUFACTURING SYSTEM

(71) Applicant: APPLIED MATERIALS, INC., Santa Clara, CA (US)

(72) Inventors: Shifang Li, Pleasanton, CA (US);
Yudong Hao, Fremont, CA (US);
Xinyuan Chong, Milpitas, CA (US);
Chengqing Wang, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 698 days.

(21) Appl. No.: 17/710,779

(22) Filed: Mar. 31, 2022

(65) Prior Publication Data

US 2023/0317481 A1    Oct. 5, 2023

(51) Int. Cl.
*H01L 21/67*        (2006.01)
*B24B 49/04*        (2006.01)
*C23C 14/54*        (2006.01)

(52) U.S. Cl.
CPC ........ *H01L 21/67248* (2013.01); *B24B 49/04* (2013.01); *C23C 14/541* (2013.01)

(58) Field of Classification Search
CPC ......... H01L 22/00; H01L 22/10; H01L 22/12; H01L 22/14; H01L 21/67248; H01L 22/20; H01L 22/26; H01J 37/32522; C23C 14/541; B24B 49/04
See application file for complete search history.

(56) References Cited

U.S. PATENT DOCUMENTS

| | | | |
|---|---|---|---|
| 6,072,164 A * | 6/2000 | Tate | C30B 31/18 392/416 |
| 11,806,828 B2 * | 11/2023 | Nakamura | B24B 49/04 |
| 2012/0133934 A1 * | 5/2012 | Barlett | H01L 21/67248 356/326 |
| 2020/0016722 A1 * | 1/2020 | Nakamura | B24B 49/105 |

* cited by examiner

*Primary Examiner* — Randy W Gibson
(74) *Attorney, Agent, or Firm* — Lowenstein Sandler LLP

(57) ABSTRACT

Methods and systems for temperature-based metrology calibration at a manufacturing system are provided. First metrology data corresponding to one or more first temperatures associated with a substrate following a completion of one or more portions of a substrate process at a manufacturing system is obtained. Second metrology data corresponding to a second temperature associated with the substrate following the completion of the substrate process is determined in view of calibration data associated with the substrate. The second temperature is different from each of the one or more first temperatures. In response to a determination, in view of the second metrology data, that a modification criterion associated with the substrate process is satisfied, the substrate process recipe is modified.

14 Claims, 9 Drawing Sheets

300

Cause a calibration substrate to be heated to a first temperature 310

Obtain first spectral data and/or non-spectral data collected for the substrate at or around the first temperature 312

Obtain second spectral data and/or non-spectral data associated with the substrate at or around a second temperature 314

Generate a calibration data based on the first spectral data and the second spectral data 316

Obtain first metrology data corresponding to one or more first temperatures associated with a substrate following a completion of one or more portions of a substrate process at a manufacturing system 410

Determine, in view of calibration data corresponding to a second temperature associated with the substrate following the completion of one or more portions of the substrate process 414

Modification criterion satisfied? 416

Proceed with execution of process recipe 418

Modify process recipe 420

FIG. 4

TEMPERATURE-BASED METROLOGY CALIBRATION AT A MANUFACTURING SYSTEM

TECHNICAL FIELD

Embodiments of the present disclosure relate, in general, to manufacturing systems and more particularly to temperature-based metrology calibration at a manufacturing system.

BACKGROUND

Substrates (e.g., wafers) can be processed at a manufacturing system according to a substrate process recipe. For example, substrates can be processed at an etch chamber and/or a deposition chamber of a manufacturing system according to an etch recipe and/or a deposition recipe. Following a substrate process, metrology measurements can be collected for the substrate (e.g., at a transfer chamber or measurement chamber of the manufacturing system, at metrology equipment external from the manufacturing system). The metrology measurement can be used (e.g., by a system controller) to determine whether the substrate satisfies a target substrate quality and consistency associated with the substrate process recipe and/or whether modifications are to be made to the process recipe (e.g., to help future processed substrates satisfy the target substrate quality and consistency). During performance of a substrate process at a process chamber, the substrate can be heated to high temperatures (e.g., 400 degrees Celsius (° C.) or higher) and can remain at a high temperature for a time period after the substrate process is completed. Metrology data collected for the substrate when the substrate is at a high temperature can be different form metrology data collected when the substrate is at a lower temperature (e.g., 25° C.) and therefore can lead to inaccurate and/or inconsistent metrology measurements. It can take a significant amount of time to cool a substrate from the high temperature to the lower temperature (e.g., seconds, minutes, etc.), and therefore can take a significant amount of time to obtain accurate metrology measurements for a substrate.

SUMMARY

Some of the embodiments described cover a method for temperature-based metrology calibration at a manufacturing system. The method includes obtaining first metrology data corresponding to a first temperature associated with a substrate following a completion of one or more portions of a substrate process at a manufacturing system. The method further includes determining, in view of calibration data associated with the substrate, second metrology data corresponding to a second temperature associated with the substrate following the completion of the one or more portions of the substrate process. The second temperature is different from the first temperature. The method further includes, responsive to determining, in view of the second metrology data, that a modification criterion associated with the substrate process is satisfied, modifying a substrate process recipe associated with the substrate process.

In some embodiments, a system includes a memory and a processing device coupled to the memory. The processing device is to identify first metrology data corresponding to a first temperature associated with a substrate following a completion of one or more portions of a substrate process at a manufacturing system. The processing device is further to provide an indication of the first metrology data and the first temperature as input to a machine learning model. The machine learning model is trained to predict metrology data associated with substrates at a target temperature based on given metrology data associated with the substrates at a different temperature. The processing device is further to obtain one or more outputs of the machine learning model. The processing device is further to extract calibration data from the one or more obtained outputs. The calibration data includes one or more sets of metrology data and, for each set of metrology data, an indication of a level of confidence that a respective set of metrology data corresponds to the target temperature. The processing device is further to identify the respective set of metrology data of the one or more sets of metrology data having a level of confidence that satisfies a confidence criterion. The respective set of metrology data corresponds second metrology data that is expected for the substrate at the target temperature following the completion of the one or more portions of the substrate process.

In some embodiments, a non-transitory computer readable storage medium includes instructions that, when executed by a processing device, cause the processing device to obtain first metrology data corresponding to a first temperature associated with a substrate following a completion of one or more portions of a substrate process at a manufacturing system. The processing device is further to determine, in view of calibration data associated with the substrate, second metrology data corresponding to a second temperature associated with the substrate following the completion of the one or more portions of the substrate process. The second temperature is different from the first temperature. The processing device is further to, responsive to determining, in view of the second metrology data, that a modification criterion associated with the substrate process is satisfied, modify a substrate process recipe associated with the substrate process.

BRIEF DESCRIPTION OF THE DRAWING

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 3 is a flow chart of a method for generating calibration data associated with a manufacturing system, according to aspects of the present disclosure.

FIG. 4 is a flow chart of a method for temperature based metrology calibration, according to aspects of the present disclosure.

DETAILED DESCRIPTION OF EMBODIMENTS

Figure 1:
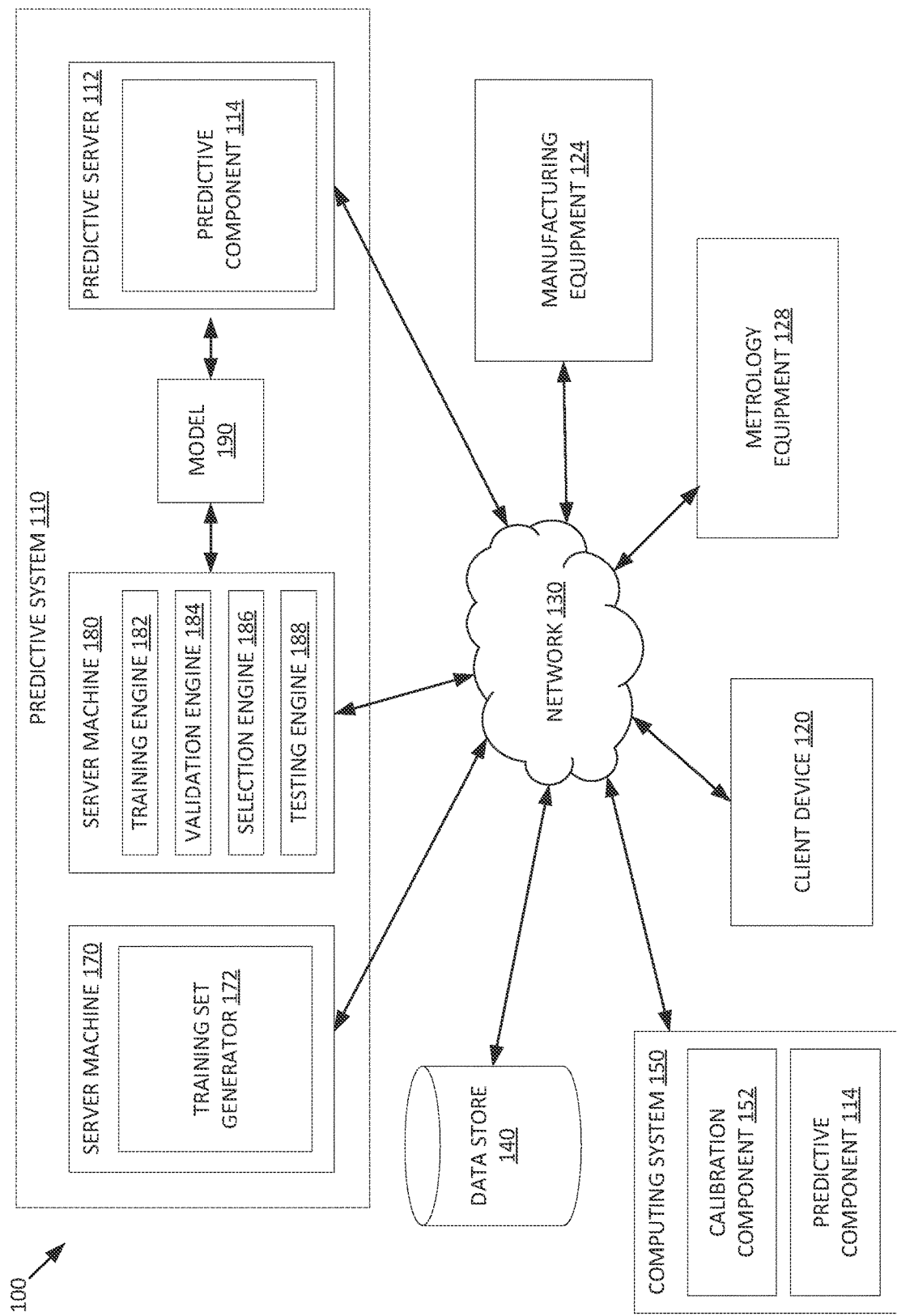
FIG. 1 depicts an illustrative system architecture, according to aspects of the present disclosure.

Implementations described herein provide systems and methods for temperature-based metrology calibration at a manufacturing system. A substrate can be processed according to a substrate process at a manufacturing system. A substrate process can include a deposition process, an etch process, a planarization process, an ion implantation process, and/or other types of processes. A deposition process refers to a process where one or more materials are deposited on a surface of a substrate. An etch process refers to a process where one or more materials on a surface of a substrate are etched away to form one or more patterns on the surface of the substrate. One or more operations of a substrate process can be performed at a process chamber of the manufacturing system. During the substrate process, the substrate and/or an environment within the process chamber can be heated to high temperatures (e.g., 400 degrees Celsius (° C.) or higher).

After completion of one or more portions of the substrate process, the substrate can be transferred to another region of the manufacturing system (e.g., a transfer chamber, etc.) where metrology data can be generated for the processed substrate. Metrology data refers to data associated with one or more properties of the substrate before, during, or after a substrate process is performed. For example, metrology data can include film property data (e.g., substrate spatial film properties), film dimensions (e.g., thickness, height, etc.), surface profile property data (e.g., an etch rate, an etch rate uniformity, a critical dimension of one or more features on a surface of the substrate, etc.). In some instances, the substrate can be transferred to a transfer chamber of the manufacturing system and metrology equipment (e.g., one or more optical emission spectrometer (OES) devices, etc.) can collect data (e.g., spectral data) associated with the substrate. A processing device associated with the manufacturing system (e.g., a processing device of a system controller, etc.) can calculate or otherwise determine the metrology data associated with the substrate based on the data for the substrate by the metrology equipment. The metrology data can be used (e.g., by the system controller, by a user or operator of the manufacturing system, etc.) to determine whether properties of the substrate correspond to target substrate properties, in view of the substrate process.

As indicated above, during a substrate process, a substrate can be heated to high temperatures (e.g., 400° C. or higher). The substrate can remain at or around the high temperature after the substrate process is completed and eventually is cooled to lower temperatures (e.g., 25° C.) after the substrate is removed from the process chamber. Metrology data that is obtained for the substrate at or around the high temperatures can be different from metrology data that is obtained for the substrate at or around lower temperatures. For instance, spectral data collected for the substrate at the high temperatures can be associated with a different reflectivity than spectral data collected for the substrate at the lower temperatures. Accordingly, metrology data obtained based on spectral data collected when the substrate is at the high temperatures can be different from metrology data obtained based on spectral data collected when the substrate is at the lower temperatures. As a substrate may be used or otherwise included in applications associated with the lower temperatures, metrology data collected for the substrate at the high temperatures can be inaccurate due to the difference in the spectral data collected for the substrate at or around the high temperatures and the low temperatures.

In conventional systems, a substrate is cooled to the low temperature (e.g., within a transfer chamber at or around 25° C., at a cooling station of the manufacturing system, etc.) before spectral data is collected for the substrate in order to obtain accurate metrology data for the substrate. However, it can take a significant amount of time for the substrate to cool to the low temperature (e.g., minutes, etc.). Given that a large number of substrates can be processed at a manufacturing system within a given time, waiting to measure each substrate until such substrate cools to the low temperature can consume a large amount of processing time at the manufacturing system, which can increase an overall latency, decrease an overall throughput, and decrease an overall efficiency of the manufacturing system.

Aspects of the present disclosure address deficiencies of the conventional technology by providing systems and methods for temperature-based metrology calibration at a manufacturing system. A substrate can be processed at a processing chamber of a manufacturing system according to a substrate process recipe. A substrate process recipe refers to a series of operations performed for the substrate and/or process settings applied in accordance with the substrate process. In some embodiments, the substrate process can be a deposition process, an etch process, and/or another type of substrate process. During the substrate process, the substrate and/or an environment within the process chamber can be heated to a high temperature (e.g., 400° C. or higher). The substrate can remain at or around the high temperature after the substrate process is completed. After the substrate process is completed, the substrate can be transferred to another region of the manufacturing system to be measured by metrology equipment. In some embodiments, the substrate can be transferred to a transfer chamber of the manufacturing system. Metrology equipment (e.g., an optical detection component, etc.) can be configured to collect spectral data associated with the substrate within the transfer chamber, in accordance with embodiments described herein. In other or similar embodiments, the substrate can be transferred to a metrology chamber of the manufacturing system. Metrology equipment at the metrology chamber can be configured to collect spectral data associated with the substrate, in accordance with embodiments described herein.

Metrology equipment can collect spectral data associated with the substrate at or around the high temperature. The collected spectral data can correspond to first metrology data associated with the substrate (e.g., metrology data associated with the substrate at or around the high temperature). A calibration component associated with the manufacturing system (e.g., running on a processing device associated with the manufacturing system) can obtain the collected spectral data and determine second metrology data associated with the substrate at or around a second temperature in view of calibration data associated with the substrate process. In some embodiments, the calibration component can determine the second metrology data by calculating a calibration factor associated with the substrate based on the calibration data. For example, the calibration data can include prior metrology data collected for a prior substrate that is cooled from a high temperature to a low temperature (or from a low temperature to a high temperature). The calibration factor can correspond to a difference between the metrology data collected for the prior substrate at the high temperature and the metrology data collected for the prior substrate at the low temperature. The calibration component can apply the calibration factor to the first metrology data associated with the substrate at the high temperature to determine second metrology data. The second metrology data can correspond to metrology data that is expected for the substrate when the substrate is cooled to the low temperature. The system controller (e.g., and/or a user or operator of the manufacturing system) can use the second metrology data to determine whether properties of the substrate correspond to target substrate properties associated with the substrate process. In other or similar embodiments, the calibration component can use one or more machine learning techniques to obtain second metrology data associated with the substrate at the lower temperature, as described in further detail herein.

Embodiments of the present disclosure enable the system controller (e.g., and/or the user or operator of the manufacturing system) to obtain the metrology data for a substrate that has cooled to a particular temperature after completion of one or more portions of a substrate process based on metrology data collected for the substrate when the substrate is at a higher temperature. Accordingly, the system controller (e.g., and/or the user or the operator of the manufacturing system) can obtain the metrology data for the substrate at the particular temperature without waiting for the substrate to cool from the higher temperature to the particular temperature. As the system controller can obtain the metrology data without waiting for the substrate to cool, the system controller can obtain metrology measurements for a larger number of substrates within a given time period, which can improve an overall throughput, improve an overall efficiency, and/or decrease an overall latency associated with the manufacturing system.

FIG. 1 depicts an illustrative system architecture 100, according to aspects of the present disclosure. In some embodiments, system architecture 100 may be included as part of a manufacturing system for processing substrates, such as manufacturing system 200 of FIG. 2. System architecture 100 may include one or more client devices 120, manufacturing equipment 124, metrology equipment 128, a predictive server 112 (e.g., to generate predictive data, to provide model adaptation, to use a knowledge base, etc.), computing system 150, and a data store 140. The predictive server 112 can be part of a predictive system 110. The predictive system 110 can further include server machines 170 and 180. The manufacturing equipment 124 can include sensors configured to capture data for a substrate being processed at the manufacturing system. In some embodiments, the manufacturing equipment 124 and sensors can be part of a sensor system that includes a sensor server (e.g., field service server (FSS) at a manufacturing facility) and sensor identifier reader (e.g., front opening unified pod (FOUP) radio frequency identification (RFID) reader for sensor system). In some embodiments, metrology equipment 128 can be part of a metrology system that includes a metrology server (e.g., a metrology database, metrology folders, etc.) and metrology identifier reader (e.g., FOUP RFID reader for metrology system). It should be noted that although metrology equipment 128 and manufacturing equipment 124 are depicted in FIG. 1 as separate components, metrology equipment 128 can be included as part of manufacturing equipment 124. For example, manufacturing equipment 124 can include a process tool, such as process tool 204 of FIG. 2. Metrology equipment 128 can be integrated within one or more components or stations of process tool 204. Further details regarding manufacturing equipment 124 and metrology equipment 128 are provided herein.

Manufacturing equipment 124 produces products following a recipe and/or performing runs over a period of time. Manufacturing equipment 124 can include one or more sensors configured to generate data for a substrate during a substrate process (referred to as sensor data). Sensor data may include a value of one or more of temperature (e.g., heater temperature), spacing (SP), pressure, high frequency radio frequency (HFRF), voltage of electrostatic chuck (ESC), electrical current, flow, power, voltage, etc. Sensor data may be associated with or indicative of manufacturing parameters such as hardware parameters, such as settings or components (e.g., size, type, etc.) of the manufacturing equipment 124, or process parameters of the manufacturing equipment 124. The sensor data can be provided while the manufacturing equipment 124 is performing manufacturing processes (e.g., equipment readings when processing products). The sensor data can be different for each substrate.

Metrology equipment 128 provides metrology data associated with substrates (e.g., wafers, etc.) processed by manufacturing equipment 124. The metrology data can include a value of one or more of film property data (e.g., wafer spatial film properties), dimensions (e.g., thickness, height, etc.), dielectric constant, dopant concentration, density, defects, etc. In some embodiments, the metrology data can further include a value of one or more surface profile property data (e.g., an etch rate, an etch rate uniformity, a critical dimension of one or more features included on a surface of the substrate, a critical dimension uniformity across the surface of the substrate, an edge placement error, etc.). The metrology data can be of a finished or semi-finished product. The metrology data can be different for each substrate.

The client device 120 includes a computing device such as personal computers (PCs), laptops, mobile phones, smart phones, tablet computers, netbook computers, network connected televisions ("smart TVs"), network-connected media players (e.g., Blu-ray player), a set-top box, over-the-top (OTT) streaming devices, operator boxes, etc. In some embodiments, the metrology data may be received from the client device 120. In some embodiments, client device 120 displays a graphical user interface (GUI), where the GUI enables the user to provide, as input, metrology measurement values for substrates processed at the manufacturing system. In other or similar embodiments, client device 120 can display another GUI that enables user to provide, as input, an indication of a type of substrate to be processed at the manufacturing system, a type of process to be performed for the substrate, and/or a type of equipment at the manufacturing system.

Data store 140 can be a memory (e.g., random access memory), a drive (e.g., a hard drive, a flash drive), a database system, or another type of component or device capable of storing data. Data store 140 can include multiple storage components (e.g., multiple drives or multiple databases) that may span multiple computing devices (e.g., multiple server computers). The data store 140 can store data associated with processing a substrate at manufacturing equipment 124. For example, data store 140 can store data collected by sensors at manufacturing equipment 124 before, during, or after a substrate process (referred to as process data). Process data can refer to historical process data (e.g., process data generated for a previous substrate processed at the manufacturing system) and/or current process data (e.g., process data generated for a current substrate processed at the manufacturing system). Current process data can be data for which predictive data is generated. In some embodiments, data store can store metrology data including historical metrology data (e.g., metrology measurement values for a prior substrate processed at the manufacturing system) and/or current historical metrology data (e.g., metrology measurement values for a current substrate being processed at the manufacturing system). The data store 140 can also store contextual data associated with one or more substrates processed at the manufacturing system. Contextual data can include a recipe name, recipe operation number, preventive maintenance indicator, operator, etc.

In some embodiments, the data store 140 can store characteristic data associated with one or more substrates at the manufacturing system. Characteristic data can correspond to one or more characteristics associated with the substrate. The characteristic data can include, but is not limited to, a type of material that of which a substrate is composed, a type of material deposited onto a substrate (e.g., during a deposition process), and so forth. In some embodiments, characteristic data associated with a substrate can correspond to metrology data collected for the substrate before, during, or after a substrate process is performed. For example, metrology equipment 128 can collect metrology data (e.g., spectral data, etc.) associated with a substrate after a deposition process is performed to deposit a film on a surface of the substrate. The metrology data, which can be raw data collected for the substrate, can indicate a thickness of the deposited film on the surface of the substrate. Characteristic data associated with the substrate can correspond to the thickness of the deposited film, and therefore the characteristic data can correspond to the metrology data collected for the substrate. In some embodiments, the characteristic data stored at data store 140 can be historical characteristic data (e.g., characteristic data associated with one or more prior substrates processed at manufacturing equipment 124) and/or current characteristic data (e.g., characteristic data associated with one or more substrates currently being processed at manufacturing equipment 124). In some embodiments, one or more calibration substrates can be included in manufacturing system 200 (e.g., in accordance with embodiments described below). A calibration substrate can be a substrate that is manufactured to have particular characteristics (e.g., a particular film thickness, etc.) that can be used to generate data for calibrating other substrates at the manufacturing system 200. In some embodiments, characteristic data stored at data store 140 can include characteristic data associated with a calibration substrate, as described above.

In some embodiments, data store 140 can be configured to store data that is not accessible to a user of the manufacturing system. For example, process data, spectral data, non-spectral data, positional data, and/or characteristic data obtained for a substrate may not be accessible to a user of the manufacturing system. In some embodiments, all data stored at data store 140 is inaccessible by a user (e.g., an operator) of the manufacturing system. In other or similar embodiments, a portion of data stored at data store 140 is inaccessible by the user while another portion of data stored at data store 140 is accessible by the user. In some embodiments, one or more portions of data stored at data store 140 are encrypted using an encryption mechanism that is unknown to the user (e.g., data is encrypted using a private encryption key). In other or similar embodiments, data store 140 includes multiple data stores where data that is inaccessible to the user is stored in one or more first data stores and data that is accessible to the user is stored in one or more second data stores.

Computing system 150 can include calibration component 152 and/or predictive component 114. Calibration component 152 can be configured to determine metrology data for a substrate at a particular temperature (e.g., 25° C.) (or a particular range of temperatures) based on metrology data collected for the substrate at a different temperature (or range of temperatures). In some embodiments, metrology equipment 128 can generate data (e.g., spectral data) associated with a substrate after the substrate is processed at a process chamber of manufacturing equipment 124, as described above. The substrate can be at a significantly high (or a significantly low temperature) following completion of one or more portions of the substrate process at the process chamber. In some embodiments, calibration component 152 can determine metrology data associated with the substrate when the substrate is at or around the particular temperature by applying a calibration factor to the metrology data generated based on the data collected for the substrate at the high temperature, in accordance with embodiments described herein. In other or similar embodiments, calibration component 152 can use machine learning techniques to determine the metrology data associated with the substrate at the particular temperature, in accordance with embodiments described herein. For example, calibration component 152 can obtain the metrology data associated with the substrate at the high temperature and provide the obtained metrology data to predictive component 114. Predictive component can provide the metrology data as input to a trained machine learning model 190, as described below. Calibration component 152 can determine the metrology data associated with the substrate at the low temperature based on one or more outputs of the trained machine learning model 190. Further details regarding calibration component 152 and predictive component 114 are described herein.

In some embodiments, predictive system 110 includes server machine 170 and server machine 180. Server machine 170 includes a training set generator 172 that is capable of generating training data sets (e.g., a set of data inputs and a set of target outputs) to train, validate, and/or test a machine learning model 190. Some operations of training set generator 172 are described in detail below with respect to FIG. 6. In some embodiments, the training set generator 172 can partition the training data into a training set, a validating set, and a testing set. In some embodiments, the predictive system 110 generates multiple sets of training data.

Server machine 180 includes a training engine 182, a validation engine 184, a selection engine 186, and/or a testing engine 188. An engine can refer to hardware (e.g., circuitry, dedicated logic, programmable logic, microcode, processing device, etc.), software (such as instructions run on a processing device, a general purpose computer system, or a dedicated machine), firmware, microcode, or a combination thereof. Training engine 182 can be capable of training a machine learning model 190. The machine learning model 190 can refer to the model artifact that is created by the training engine 182 using the training data that includes training inputs and corresponding target outputs (correct answers for respective training inputs). The training engine 182 can find patterns in the training data that map the training input to the target output (the answer to be predicted), and provide the machine learning model 190 that captures these patterns. In some embodiments, the machine learning model 190 uses one or more of support vector machine (SVM), Radial Basis Function (RBF), clustering, supervised machine learning, semi-supervised machine learning, unsupervised machine learning, k-nearest neighbor algorithm (k-NN), linear regression, partial least square regression, ridge regression, random forest, Gaussian Process Regression, neural network (e.g., artificial neural network), etc.

The validation engine 184 can be capable of validating a trained machine learning model 190 using a corresponding set of features of a validation set from training set generator 172. The validation engine 184 can determine an accuracy of each of the trained machine learning models 190 based on the corresponding sets of features of the validation set. The validation engine 184 can discard a trained machine learning model 190 that has an accuracy that does not meet a threshold accuracy. In some embodiments, the selection engine 185 can be capable of selecting a trained machine learning model 190 that has an accuracy that meets a threshold accuracy. In some embodiments, the selection engine 185 can be capable of selecting the trained machine learning model 190 that has the highest accuracy of the trained machine learning models 190.

The testing engine 188 can be capable of testing a trained machine learning model 190 using a corresponding set of features of a testing set from training set generator 172. For example, a first trained machine learning model 190 that was trained using a first set of features of the training set can be tested using the first set of features of the testing set. The testing engine 188 can determine a trained machine learning model 190 that has the highest accuracy of all of the trained machine learning models based on the testing sets.

Predictive server 112 includes a predictive component 114 that is capable of providing metrology data associated with a substrate at a particular temperature following a current process performed for the substrate as input to trained machine learning model 190 and running trained machine learning model 190 on the input to obtain one or more outputs. As described in detail below with respect to FIG. 2, in some embodiments, predictive component 114 is also capable of extracting calibration data from the one or more outputs of the trained machine learning model and using the one or more outputs to determine metrology data associated with the substrate at a target temperature (e.g., 25° C.). In some embodiments, predictive component 114 can provide the one or more outputs of the trained machine learning model 190 to calibration component 152 and calibration component 152 can determine the metrology data associated with the substrate at the target temperature. Calibration component 152 can update a process recipe associated with the substrate in view of the determined metrology data associated with the substrate at the target temperature, in accordance with embodiments described herein.

The client device 120, manufacturing equipment 124, metrology equipment 128, predictive server 112, data store 140, computing system 150, server machine 170, and server machine 180 can be coupled to each other via a network 130. In some embodiments, network 130 is a public network that provides client device 120 with access to computing system 150, predictive server 112, data store 140, and/or other publically available computing devices. In some embodiments, network 130 is a private network that provides client device 120 access to manufacturing equipment 124, metrology equipment 128, data store 140, and other privately available computing devices. Network 130 can include one or more wide area networks (WANs), local area networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/or a combination thereof.

It should be noted that in some other implementations, the functions of server machines 170 and 180, as well as predictive server 112, may be provided by a fewer number of machines. For example, in some embodiments, server machines 170 and 180 may be integrated into a single machine, while in some other or similar embodiments, server machines 170 and 180, as well as predictive server 112, may be integrated into a single machine. In other or similar embodiments, server machines 170 and 180, predictive server 112, and/or computing system 150 can be integrated into a single machine or one or more machines.

In general, functions described in one implementation as being performed by computing system 150, server machine 170, server machine 180, and/or predictive server 112 can also be performed on client device 120. In addition, the functionality attributed to a particular component can be performed by different or multiple components operating together.

In embodiments, a "user" can be represented as a single individual. However, other embodiments of the disclosure encompass a "user" being an entity controlled by a plurality of users and/or an automated source. For example, a set of individual users federated as a group of administrators may be considered a "user."

Figure 2:
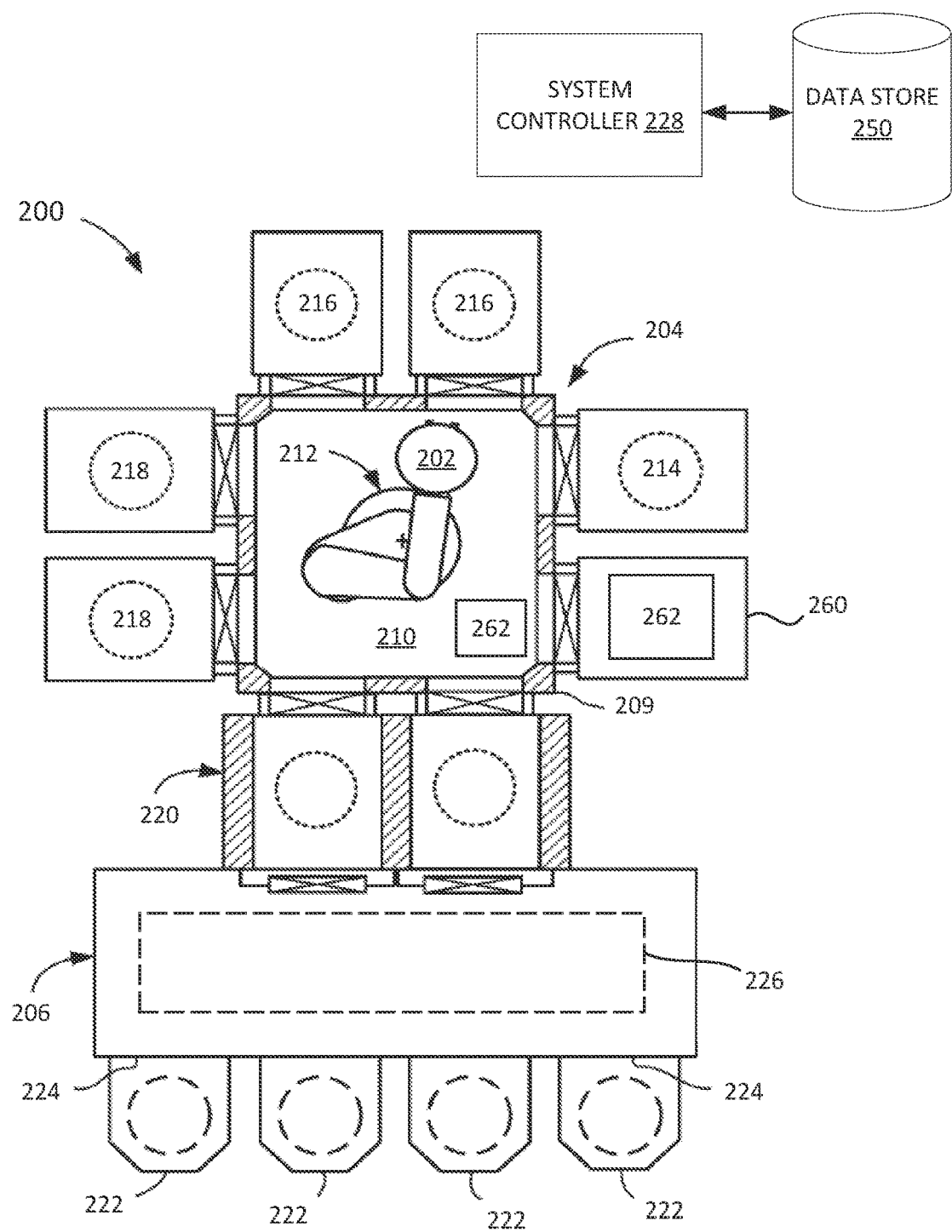
FIG. 2 is a top schematic view of an example manufacturing system, according to aspects of the present disclosure.

FIG. 2 is a top schematic view of an example manufacturing system 200, according to aspects of the present disclosure. Manufacturing system 200 may perform one or more processes on a substrate 202. Substrate 202 may be any suitably rigid, fixed-dimension, planar article, such as, e.g., a silicon-containing disc or wafer, a patterned wafer, a glass plate, or the like, suitable for fabricating electronic devices or circuit components thereon.

Manufacturing system 200 may include a process tool 204 and a factory interface 206 coupled to process tool 204. Process tool 204 can include a housing 208 having a transfer chamber 210 therein. Transfer chamber 210 can include one or more processing chambers (also referred to as process chambers) 214, 216, 218 disposed therearound and coupled thereto. Additionally or alternatively, transfer chamber 210 can further include a metrology chamber 260 coupled thereto, in some embodiments. Processing chambers 214, 216, 218 and/or metrology chamber 260 can be coupled to transfer chamber 210 through respective ports, such as slit valves or the like. Transfer chamber 210 can also include a transfer chamber robot 212 configured to transfer substrate 202 between process chambers 214, 216, 218, load lock 220, metrology chamber 260, etc. Transfer chamber robot 212 can include one or multiple arms where each arm includes one or more end effectors at the end of each arm. The end effector may be configured to handle particular objects, such as wafers.

Processing chambers 214, 216, 218 can be adapted to carry out any number of processes on substrates 202. A same or different substrate process can take place in each processing chamber 214, 216, 218. A substrate process can include atomic layer deposition (ALD), physical vapor deposition (PVD), chemical vapor deposition (CVD), etching, annealing, curing, pre-cleaning, metal or metal oxide removal, or the like. Other processes can be carried out on substrates therein. Processing chambers 214, 216, 218 can each include one or more sensors configured to capture data for substrate 202 before, after, or during a substrate process. For example, the sensors can be configured to capture spectral data and/or non-spectral data for a portion of substrate 202 during a substrate process. In other or similar embodiments, the sensors can be configured to capture data associated with the environment within processing chamber 214, 216, 218 before, after, or during the substrate process. For example, the sensors may be configured to capture data associated with a temperature, a pressure, a gas concentration, etc. of the environment within processing chamber 214, 216, 218 during the substrate process.

In some embodiments, metrology equipment 128 can be included or otherwise coupled to transfer chamber 210 and can be configured to collect spectral data and/or non-spectral data associated with substrate 202 before and/or after substrate 202 is transferred between process chambers 214, 216, 218, load lock 220, etc. Metrology equipment 128 can include one or more optical detection components 262, in some embodiments. An optical detection component 262 can be configured to collect spectral data associated with substrate 202 based on one or more signals received by sensors of optical detection component 262. For example, optical detection component 262 can be coupled to a photon source (e.g., a light source) via a photon transmission cable (e.g., a fiber optic cable). Optical detection component 262 can transmit photons received via the photon transmission cable to one or more portions of a surface of substrate 202 within transfer chamber 210. The transmitted photons can be reflected back to optical detection component 262 from the one or more portions of the surface of substrate 202 and can be received by one or more sensors of optical detection component 262. The sensors of optical detection component 262 can collect spectral data and/or non-spectral data associated with the substrate 202 based on the reflected photons, in some embodiments. Optical detection component 262 can provide the collected spectral data and/or non-spectral data to a system controller 228, in accordance with embodiments described herein.

In some embodiments, the sensors of optical detection component 262 can include one or more reflectometry sensors. In such embodiments, spectral data generated by optical detection component 262 can correspond a reflected optical intensity of each wavelength of a wave reflected from a portion of substrate 202. In other or similar embodiments, the sensors of optical detection component 262 can include one or more ellipsometry sensors. In such embodiments, spectral data generated by the optical detection component 262 can include a reflected optical intensity of a wavelength of a polarized light wave reflected from a portion of substrate 202. In other or similar, optical detection component 262 can include other types of sensors, such as thermal spectra sensors, x-ray sensors, and so forth.

In some embodiments, the optical detection component 262 can be displaced outside of transfer chamber 210. For example, a lid or another portion of transfer chamber 210 can include a transparent window that optically exposes an internal environment of the transfer chamber 210 to an environment outside of the transfer chamber 210. The optical component 262 can be configured to transmit photons from the environment outside of the transfer chamber 210, through the transparent window, and onto a surface of substrate 202. Photons can be reflected from the surface of substrate 202 to optical detection component 262 through the transparent window. The sensors of optical detection component 262 can receive the reflected photons and can collect spectral and/or non-spectral data associated with the substrate based on the reflected photons, as described above. In other or similar embodiments, one or more portions of optical detection component 262 can be displaced within transfer chamber 210. For example, one or more portions of optical detection component 262 can be mounted to a ceiling and/or one or more walls of transfer chamber 210 and can be configured to collect spectral data and/or non-spectral data associated with substrate 202, in accordance with embodiments herein.

In additional or alternative embodiments, a metrology chamber 260 can be coupled to transfer chamber 210. Metrology chamber 260 can include metrology equipment 128 that is configured to collect spectral data and/or non-spectral data associated with substrate 202, in accordance with previously described embodiments. Before and/or after a substrate 202 is processed at a process chamber 214, 216, 218, transfer robot 212 can transfer substrate 202 to metrology chamber 260 (e.g., from process chamber 214, 216, 218, from load lock 220, etc.). Metrology equipment 128 can collect spectral data and/or non-spectral data associated with substrate 202 when substrate 202 is transferred to metrology chamber 260. In some embodiments, metrology equipment 128 can include an optical detection component 262. For example, optical detection component 262 can be displaced within or outside of metrology chamber 260, in accordance with embodiments described with respect to transfer chamber 210. Optical detection component 262 can collect the spectral data and/or non-spectral data associated with substrate 202 at metrology chamber 260, in accordance with previously described embodiments, and can provide the collected spectral data and/or non-spectral data to system controller 228, as described below.

It should be noted that although FIG. 2 depicts metrology chamber 260 to be coupled to transfer chamber 210 (e.g., within a vacuum environment), metrology chamber 260 can be coupled to other regions of process tool 204. For example, in some embodiments, metrology chamber 260 can be coupled to or otherwise included at factory interface 206 (e.g., outside of the vacuum environment), or another region of process tool 204. In other or similar embodiments, metrology chamber 260 can be coupled to or included in a station that is separate from process tool 204. For example, metrology chamber 260 can be included in metrology equipment that is external from process tool 204 and/or manufacturing system 200.

As described above, in some embodiments, a substrate 202 can be heated to a high temperature (e.g., 400° C. or higher) prior to and/or during a substrate process performed at a process chamber 214, 216, 218. After the substrate process is complete, the substrate 202 can remain at the high temperature for a period of time. Spectral data associated with the substrate 202 can be collected by optical detection component 262 (e.g., of transfer chamber 210, of metrology chamber 260, etc.) while substrate 202 is at or around the high temperature, in some embodiments. In some embodiments, spectral data can be collected for substrate 202 by optical detection component 262 while substrate 202 is at or around the high temperature and as substrate 202 cools to a low temperature (e.g., 25° C.). The collected spectral data can be used to generate calibration data associated with the substrate process, in accordance with embodiments described herein.

A load lock 220 can also be coupled to housing 308 and transfer chamber 210. Load lock 220 can be configured to interface with, and be coupled to, transfer chamber 210 on one side and factory interface 206. Load lock 220 can have an environmentally-controlled atmosphere that can be changed from a vacuum environment (wherein substrates may be transferred to and from transfer chamber 210) to an at or near atmospheric-pressure inert-gas environment (wherein substrates can be transferred to and from factory interface 206), in some embodiments. Load lock 220 can include one or more sensors to capture data associated with substrate 202 before, after, or during a substrate process at processing chambers 214, 216, 218. For example, load lock 220 can include a vibration sensor (e.g., a piezoelectric sensor) configured to detect and monitor an amount of vibration occurring within load lock 220 during a substrate process at processing chambers 214, 216, 218. In another example, load lock 220 can include a temperature sensor (e.g., an infrared camera) to detect and monitor a temperature of load lock 220 during a substrate process. It should be noted that, although embodiments of the present disclosure describe sensors such as a vibration sensor or a temperature sensor at load lock 220 to monitor a state of load lock 220 during a substrate process, any type of sensor can be used at any station of manufacturing system 100 to monitor the state and/or health of the station during a substrate process.

Factory interface 206 may be any suitable enclosure, such as, e.g., an Equipment Front End Module (EFEM). Factory interface 206 may be configured to receive substrates 302 from substrate carriers 222 (e.g., Front Opening Unified Pods (FOUPs)) docked at various load ports 224 of factory interface 206. A factory interface robot 226 (shown dotted) can be configured to transfer substrates 202 between carriers (also referred to as containers) 222 and load lock 220. Carriers 222 can include a substrate storage carrier and/or a replacement part storage carrier. Factory interface 206 and/or carriers 222 may include sensors (e.g., a vibration sensor, a temperature sensor, etc.) to capture data associated with substrate 202 before, after, or during a substrate process at processing chambers 214, 216, 218, as previously described.

Manufacturing system 200 can also include a system controller 228. System controller 228 can be and/or include a computing device such as a personal computer, a server computer, a programmable logic controller (PLC), a microcontroller, and so on. System controller 228 may include one or more processing devices, which may be general-purpose processing devices such as a microprocessor, central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device can also be one or more special-purpose processing devices such as an application specific integrated circuit (ASIC), a field programmable gate array (FPGA), a digital signal processor (DSP), network processor, or the like. System controller 228 may include a data storage device (e.g., one or more disk drives and/or solid state drives), a main memory, a static memory, a network interface, and/or other components. System controller 228 can execute instructions to perform any one or more of the methodologies and/or embodiments described herein. In some embodiments, system controller 228 may execute instructions to perform one or more operations at manufacturing system 200 in accordance with a process recipe. The instructions can be stored on a computer readable storage medium, which may include the main memory, static memory, secondary storage and/or processing device (during execution of the instructions).

As described with respect to FIG. 1, calibration component 152 can run on a computing system 150 associated with manufacturing system 200. In some embodiments, system controller 228 can correspond to computing system 150 and, accordingly, calibration component 152 can be a component of system controller 228. In other or similar embodiments, system controller 228 can be connected to computing system 150 (e.g., via network 130). In such embodiments, system controller 228 can transmit data to and/or receive data from computing system 150 via network 130.

System controller 228 can receive data from sensors included on or within various portions of manufacturing system 200 (e.g., processing chambers 214, 216, 218, transfer chamber 210, metrology chamber 260, load lock 220, etc.). In some embodiments, system controller 228 can receive spectral data and/or non-spectral data collected by one or more sensors of optical detection component 262. In some embodiments, system controller 228 can determine metrology data associated with substrate 202 based on spectral data and/or non-spectral data received from optical detection component 262. For example, system controller 228 can determine a thickness of a film deposited on a surface of substrate 202 by comparing spectral data collected for substrate 202 with other spectral data collected for another substrate having a film associated with a known thickness. System controller 228 can determine the metrology data associated with substrate 202 according to other techniques, in some embodiments.

In some embodiments, substrate 202 can be a calibration substrate. A calibration substrate can be a substrate that has been processed to include a particular set of features. For example, a calibration substrate can be processed to include a film having a particular thickness within a particular degree of accuracy (e.g., within 1% of accuracy). In some embodiments, the calibration substrate can be processed at a process chamber 214, 216, 218 of manufacturing system 200. In other or similar embodiments, the calibration substrate can be processed at another manufacturing system. Spectral data and/or non-spectral data can be collected for the calibration substrate, in accordance with previously described embodiments. In some embodiments, calibration component 152 and/or system controller 228 can determine metrology data based on the collected spectral data and/or non-spectral data associated with the calibration substrate, as described above, and calibration component 152 can generate or otherwise determine calibration data based on the determined metrology data. Details regarding calibration data are provided in further details with respect to FIG. 3 and FIGS. 5A-5B. In additional or alternative embodiments, system controller 228 and/or calibration component 152 can provide the metrology data associated with the calibration substrate to predictive component 114 and/or other components or engines of predictive system 110, described with respect to FIG. 1. Predictive component 114 and/or the other components or engines of predictive system 110 can use the metrology data to train a machine learning model, in accordance with embodiments described herein.

In additional or alternative embodiments, substrate 202 is not a calibration substrate. In such embodiments, substrate 202 can be referred to as a process substrate. Optical detection component 262 can collect spectral data and/or non-spectral data for substrate 202, as described above. In some embodiments, optical detection component 262 can collect spectral data and/or non-spectral data for substrate 202 when substrate 202 is at a high temperature following a substrate process, as described above. Calibration component 152 and/or system controller 228 can determine metrology data based on the collected spectral data and/or non-spectral data and can determine metrology data associated with substrate 202 when substrate 202 is at a lower temperature (e.g., 25° C.) based on calibration data. For example, calibration component 152 can determine a calibration factor based on calibration data associated with the substrate process and can apply the calibration factor to the metrology data associated with the substrate 202 when the substrate is at or around a high temperature to obtain metrology data associated with the substrate 202 at the low temperature. In another example, calibration component 152 can provide the metrology data associated with the substrate 202 at the high temperature to predictive component 114, in some embodiments. Predictive component 114 can provide the metrology data as input to a trained machine learning model and can determine the metrology data associated with the substrate 202 at the lower temperature based on one or more outputs of the trained machine learning model. Further details regarding determining the metrology associated with the substrate 202 at the lower temperature are provided with respect to FIGS. 4, 5C-5D and FIG. 7.

As illustrated in FIG. 2, system controller 228 can be connected to data store 250 (e.g., via a network 130). System controller 228 can store spectral data and/or non-spectral data at data store 250, in some embodiments. In additional or alternative embodiments, system controller 228 can store metrology data generated based on spectral data and/or non-spectral data at data store 250. In some embodiments, calibration component 152 can store calibration data at data store 250. In yet additional or alternative embodiments, predictive component 114 can store machine learning model 190 and/or outputs of machine learning model 190 at data store 250. In some embodiments, data store 350 may be data store 140 described with respect to FIG. 1.

FIG. 3 is a flow chart of a method for generating calibration data associated with a manufacturing system, according to aspects of the present disclosure. Method 300 is performed by processing logic that can include hardware (circuitry, dedicated logic, etc.), software (such as is run on a general purpose computer system or a dedicated machine), firmware, or some combination thereof. In one implementation, method 300 can be performed by one or more components of a system architecture, such as system architecture 100 of FIG. 1. In other or similar implementations, one or more operations of method 300 can be performed by one or more other machines not depicted in the figures. In some aspects, one or more operations of method 300 can be performed by calibration component 152 of computing system 150. In other or similar aspects, one or more operations of method 300 can be performed by system controller 228.

For simplicity of explanation, the methods are depicted and described as a series of acts. However, acts in accordance with this disclosure can occur in various orders and/or concurrently, and with other acts not presented and described herein. Furthermore, not all illustrated acts can be performed to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term article of manufacture, as used herein, is intended to encompass a computer program accessible from any computer-readable device or storage media.

At block 310, processing logic causes a calibration substrate to be heated to a first temperature. As indicated above, system controller 228 can execute instructions to perform one or more operations associated with manufacturing system 200. In some embodiments, system controller 228 can execute one or more instructions to cause transfer robot 212 to transfer a substrate 202 to a process chamber 214, 216, 218 of manufacturing system 200. In some embodiments, the substrate 202 can be a calibration substrate, as described above. Responsive to detecting that the calibration substrate is transferred to the process chamber 214, 216, 218, system controller 228 can execute one or more instructions to cause a temperature of the calibration substrate 202 and/or an environment within the process chamber 214, 216, 218 to increase to a high temperature. In some embodiments, the calibration substrate 202 can be placed on a substrate support assembly within process chamber 214, 216, 218. The substrate support assembly can include one or more heating elements (e.g., heaters) that are configured to heat a substrate disposed on the substrate support assembly. System controller 228 can transmit a signal to the heating elements (e.g., or a controller connected to the one or more heating elements) to cause the heating elements to increase the temperature of the calibration substrate to the high temperature. In additional or alternative embodiments, the process chamber 214, 216, 218 can include one or more heating elements that are configured to heat an environment within process chamber 214, 216, 218. System controller 228 can transmit a signal to the heating elements (or a controller connected to the one or more heating elements) to cause the heating elements to increase the temperature of the environment within process chamber 214, 216, 218 to the high temperature. When the environment within process chamber 214, 216, 218 is heated to the high temperature, the calibration substrate can also be heated to the high temperature (e.g., via radiant heat transfer, convection heat transfer, etc.).

In some embodiments, a substrate support assembly and/or one or more regions of process chamber 214, 216, 218 can include one or more temperature sensors that are configured to monitor a temperature of a substrate 202 disposed within the substrate support assembly and/or an environment within process chamber 214, 216, 218. In such embodiments, the one or more temperature sensors can transmit a signal to system controller 228 that indicates a temperature of the calibration substrate and/or the environment within process chamber 214, 216, 218. System controller 228 can determine whether the calibration substrate and/or the environment within process chamber 214, 216, 218 is heated to the high temperature based on the received signal. In additional or alternative embodiments, the calibration substrate can include one or more temperature sensors that are configured to monitor the temperature of the calibration substrate. The one or more temperature sensors can transmit a signal to system controller 228 indicating the temperature of the calibration substrate and system, controller 228 can determine whether the calibration substrate is heated to the high temperature based on the received signal, as described above.

In response to determining that the calibration substrate and/or the environment within process chamber 214, 216, 218 is heated to the high temperature, system controller 228 can transmit a signal to the one or more heating elements to stop increasing the temperature of the calibration substrate and/or the environment. System controller 228 can execute one or more instructions to cause the transfer robot 212 to transfer the substrate out of process chamber 214, 216, 218 so that spectral and/or non-spectral data can be collected for the calibration substrate. For example, system controller 228 can transmit a signal to cause the transfer robot 212 to transfer the calibration substrate out of process chamber 214, 216, 218 and to a region of transfer chamber 210 where metrology equipment 128 (e.g., optical detection component 262) can collect spectral and/or non-spectral data associated with the calibration substrate, as described below. In another example, system controller 228 can transmit a signal to cause the transfer robot 212 to transfer the calibration substrate out of process chamber 214, 216, 218 to metrology chamber 260 where metrology equipment 128 can collect spectral and/or non-spectral data associated with the calibration substrate.

At block 312, processing logic can obtain first spectral data and/or non-spectral data collected for the substrate at or around the first temperature (e.g., the high temperature). At block 314, processing logic obtains second spectral data and/or non-spectral data associated with the substrate at or around a second temperature (e.g., a low temperature). As described above, system controller 228 can cause transfer robot 212 to transfer the calibration substrate from process chamber 214, 216, 218 to transfer chamber 210 and/or metrology chamber 260 where metrology equipment 128 can collect spectral and/or non-spectral data associated with the calibration substrate. When transfer robot 212 transfers the calibration substrate from process chamber 214, 216, 218, the calibration substrate can be at or around the high temperature. Optical detection component 262 can collect spectral data and/or non-spectral data associated with the calibration substrate, in accordance with previously described embodiments. In some embodiments, optical detection component 262 can collect spectral data and/or non-spectral data associated with the calibration substrate from a time period when the calibration substrate is at or around the first temperature until a time period that the calibration substrate cools to the second temperature. In additional or alternative embodiments, optical detection component 262 can collect spectral data and/or non-spectral data at a time period when the calibration substrate is at or around the first temperature. Optical detection component 262 can stop collecting spectral data and/or non-spectral data for another time period and can resume collecting spectral data and/or non-spectral data associated with the substrate at or around a time period when the calibration substrate is at the second temperature.

Figure 5A:
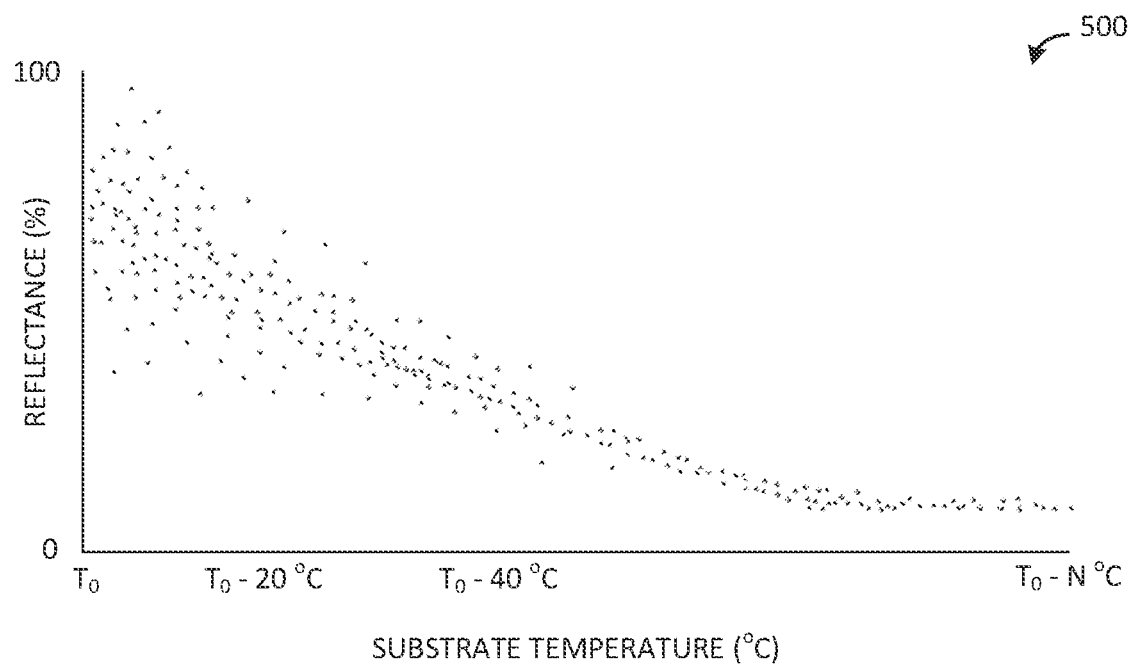
FIGS. 5A-5D depicts an example of temperature-based metrology calibration, according to aspects of the present disclosure.

FIG. 5A illustrates spectral data and/or non-spectral data collected for a substrate, in accordance with embodiments of the present disclosure. In some embodiments, the data illustrated in FIG. 5A can correspond to spectral data and/or non-spectral data collected for the calibration substrate, as described above. FIG. 5A depicts a graph 500 that indicates a reflectance associated with a calibration substrate as the calibration substrate cools from at or around a first temperature $T_0$ (e.g., a high temperature, such as 400° C. or higher) to a second temperature $T_0$–N ° C. (e.g., a low temperature, such as 25° C.). The reflectance associated with the calibration substrate can correspond to metrology data associated with the calibration substrate, as described above. In some embodiments, graph 500 can include reflectance data measured for a single calibration substrate and/or multiple calibration substrates at or around the first temperature $T_0$ to the second temperature $T_0$–N ° C. It should be noted that reflectance data is included in FIG. 5A for purposes of example only. Other types of spectral and/or non-spectral data can be collected for a calibration substrate at a first temperature and/or a second temperature, in accordance with embodiments described herein.

Referring back to FIG. 3, at block 316, processing logic generates calibration data based on the first spectral data and the second spectral data. In some embodiments, the calibration data can correspond to a calibration curve, such as calibration curve 510 illustrated in FIG. 5B. In some embodiments, system controller 228 (e.g., and/or calibration component 152) can apply one or more normalization functions to the spectral data and/or non-spectral data collected for the calibration substrate to determine the calibration curve 510. A normalization function refers to a data transformation function that normalizes a set of data points to derive a standard set of data points. In one example, calibration component 152 can apply one or more normalization functions to determine an aggregate (e.g., an average, a mean, etc.) reflectance associated with a respective substrate temperature based on the spectral data and/or non-spectral data collected for the calibration substrate (and/or additional calibration substrates), as described above.

Figure 5B:
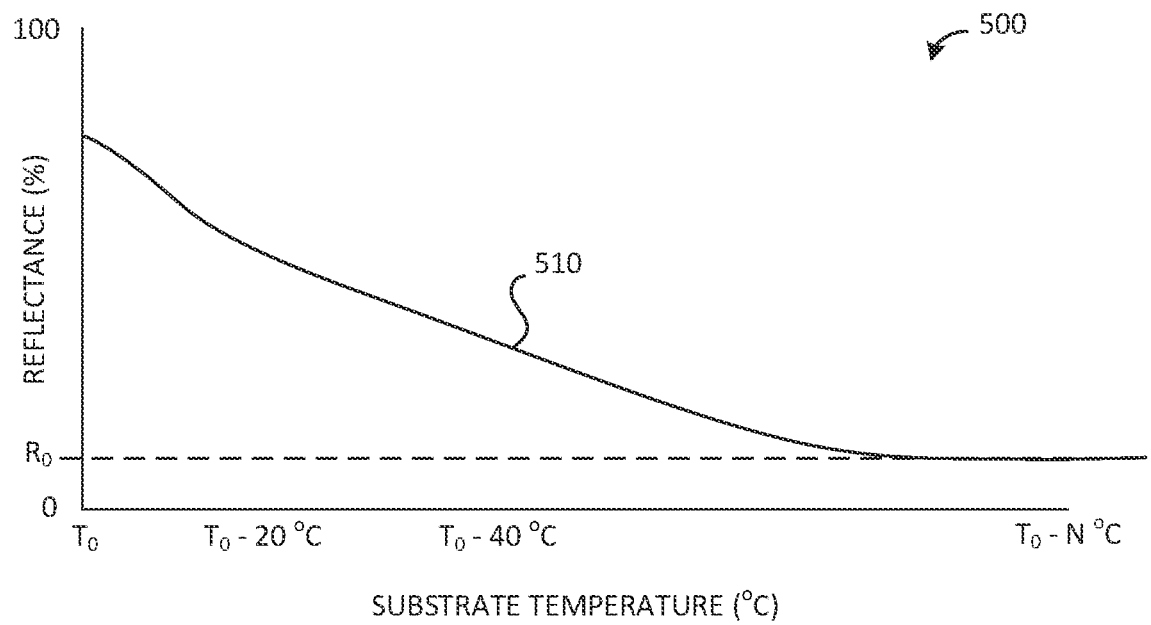

Calibration component 152 can obtain calibration curve 510 based on one or more outputs of the normalization functions, in some embodiments. As illustrated in FIG. 5B, at or around substrate temperature $T_0$–N ° C., the reflectance measured for the one or more calibration substrates converges to a particular reflectance $R_0$. Calibration component 152 can determine, based on calibration curve 510, that the reflectance measured for a respective substrate processed at manufacturing system 200 is to be at or around reflectance $R_0$ when the respective substrate is at or around the low temperature. Calibration component 152 can use the determined reflectance for a substrate at the low temperature and/or other data associated with calibration curve 510 to determine metrology data associated with a substrate processed at manufacturing system 200, in accordance with embodiments described herein.

FIG. 4 is a flow chart of a method 400 for temperature based metrology calibration, according to aspects of the present disclosure. Method 400 is performed by processing logic that can include hardware (circuitry, dedicated logic, etc.), software (such as is run on a general purpose computer system or a dedicated machine), firmware, or some combination thereof. In one implementation, method 400 can be performed by one or more components of a system architecture, such as system architecture 100 of FIG. 1. In other or similar implementations, one or more operations of method 400 can be performed by one or more other machines not depicted in the figures. In some aspects, one or more operations of method 400 can be performed by calibration component 152 of computing system 150. In other or similar aspects, one or more operations of method 400 can be performed by system controller 228.

For simplicity of explanation, the methods are depicted and described as a series of acts. However, acts in accordance with this disclosure can occur in various orders and/or concurrently, and with other acts not presented and described herein. Furthermore, not all illustrated acts can be performed to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term article of manufacture, as used herein, is intended to encompass a computer program accessible from any computer-readable device or storage media.

At block 410, processing logic obtains first metrology data corresponding to one or more first temperatures associated with a substrate following a completion of one or more portions of a substrate process at a manufacturing system. As described above, a substrate process (e.g., a deposition process, an etch process, etc.) can be performed for a substrate 202 at a process chamber 214, 216, 218 of manufacturing system 200. In some embodiments, the substrate 202 and/or an environment surrounding substrate 202 can be heated to a first temperature (e.g., a high temperature), as described above. Spectral data and/or non-spectral data can be collected for substrate 202 by metrology equipment 128 (e.g., optical detection component 262) as the substrate 202 is at or around the first temperature, as described above. In one example, spectral data and/or non-spectral data can be collected for substrate 202 as the substrate is at the first temperature until the substrate is cooled to a temperature that is lower than the first temperature (or heated to a temperature that is higher than the first temperature). The collected spectral data and/or non-spectral data can correspond to first metrology data associated with the substrate 202 at or around the first temperature, in accordance with previously described embodiments.

At block 412, processing logic determines, in view of calibration data associated with the substrate, second metrology data corresponding to a second temperature associated with the substrate following the completion of one or more portions of the substrate process. In some embodiments, the second temperature can be different from each of the one or more first temperatures. For example, the one or more first temperatures can include a high temperature (e.g., at or around 400° C. or higher) and the second temperature can be a low temperature (e.g., around 25° C.). In some embodiments, processing logic (e.g., calibration component 152) can determine the second metrology data by calculating a calibration factor associated with the substrate based on the calibration data and applying the calibration data to the first metrology data to determine the second metrology data. The calibration factor can correspond to a difference between prior metrology data measured for a prior substrate (e.g., a calibration substrate) at or around the one or more first temperatures and the current metrology data measured for a current substrate at or around the one or more first temperatures, in some embodiments.

As described with respect to FIGS. 3 and 5A-5B, system controller 228 (and/or calibration component 152) can obtain spectral data and/or non-spectral data associated with a calibration substrate as the calibration substrate cools from a high temperature to a low temperature. The obtained spectral data and/or non-spectral data can correspond to metrology data for the calibration substrate at or around the high temperature and the low temperature. Calibration component 152 can calculate a calibration factor for substrate 202 based on the spectral data and/or non-spectral data associated with the calibration substrate. In in illustrative example, during a substrate process, substrate 202 can be heated to a temperature of around $T_0$. Spectral data and/or non-spectral data can be collected for substrate 202 when substrate 202 is at or around the temperature of $T_0$. For instance, substrate 202 can cool slightly as substrate 202 is transferred from process chamber 214, 216, 218 to be measured by metrology equipment 128. Accordingly, metrology equipment 128 can collect spectral data and/or non-spectral data associated with substrate 202 when substrate 202 is at a temperature of $T_0-20°$ C. It should be noted that spectral data and/or non-spectral data can be collected for substrate 202 as the substrate 202 is at multiple temperatures. For example, metrology equipment 128 can collect spectral data and/or non-spectral when the substrate is at a temperature of $T_0-20°$ C. until the substrate is at a temperature of $T_0-30°$ C.

Figure 5C:
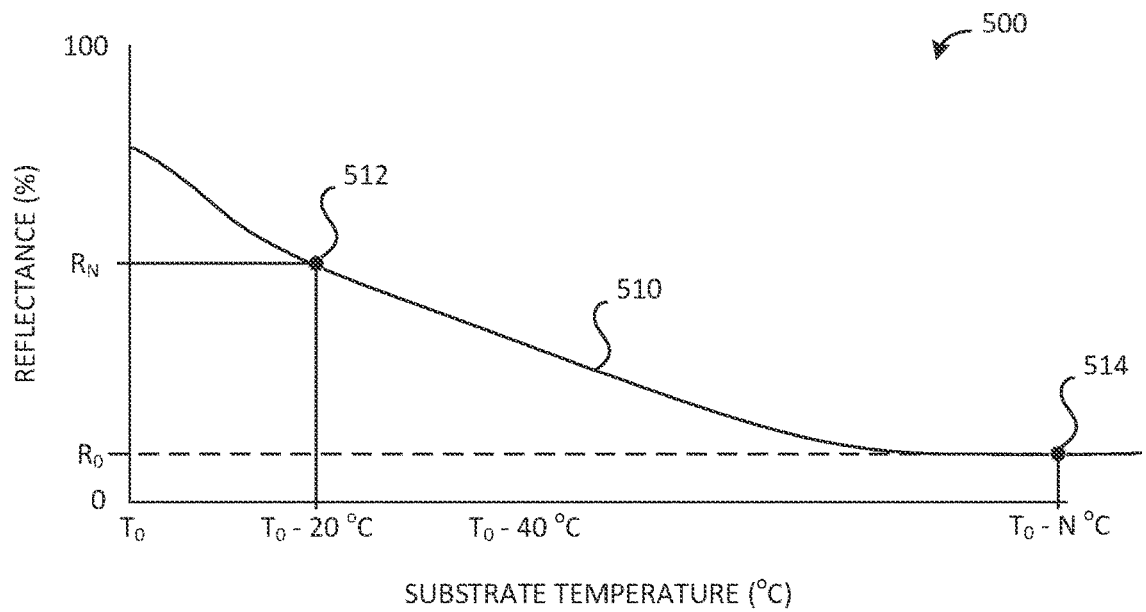

The spectral data and/or non-spectral collected for substrate 202 at the temperature of $T_0-20°$ C. (e.g., and/or between the temperatures of $T_0-20°$ C. and $T_0-30°$ C.) can correspond to a reflectance of $R_N$. As illustrated in FIG. 5C, the measured reflectance of $R_N$ for a substrate at or around a temperature of $T_0-20°$ C. falls, or approximately falls, on calibration curve 510 (e.g., approximately corresponds to the reflectance measured for the calibration substrate when the calibration substrate was at or around the temperature of $T_0-20°$ C.). Accordingly, in view of calibration curve 510, calibration component 152 can determine that a difference between the reflectance measured for substrate 202 at temperature $T_0-20°$ C. and the reflectance measured for the calibration substrate at temperature $T_0-20°$ C. is approximately 0. Calibration component 152 can therefore calculate a calibration factor for substrate 202 to be approximately 0 units. Calibration component 152 can determine, based on calibration curve 510, that when the calibration substrate was cooled to the lower temperature (e.g., $T_0-N°$ C.), the measured reflectance for the calibration substrate was approximately $R_0$. Calibration component 152 can apply the calculated calibration factor to the reflectance measured for the calibration substrate at or around the lower temperature (e.g., $T_0-N°$ C.) to determine the metrology data associated with substrate 202 at or around the lower temperature (e.g., $T_0-N°$ C.). In some embodiments, calibration component 152 can apply the calibration factor by adding (or subtracting) the value of the calibration factor to the reflectance measured for the calibration substrate at or around the lower temperature. For example, calibration component 152 can add the value of the calibration factor (e.g., 0 units) to the reflectance measured for the calibration substrate at or around the lower temperature (e.g., $R_N$) to determine that the reflectance associated with substrate 202 is expected to be approximately $R_N$ (e.g., $R_N$+0 units) at or around the lower temperature. Accordingly, calibration component 152 determines that metrology data 514 associated with substrate 202 at or around the lower temperature (e.g., $T_0-N°$ C.) correspond to a reflectance of approximately $R_N$.

It should be noted that calibration component 152 can calculate a calibration factor in view of reflectance data collected for a range of temperatures collected for substrate 202. For example, as indicated above, spectral data and/or non-spectral data can be collected for substrate 202 between the temperatures of $T_0-20°$ C. and $T_0-30°$ C. Calibration component 152 can calculate the calibration factor for substrate 202 in view of a difference between the reflectance measured for substrate 202 between the temperatures of $T_0-20°$ C. and $T_0-30°$ C., as described above.

Referring back to FIG. 4, at block 416, processing logic can determine whether a modification criterion associated with the substrate is satisfied in view of the second metrology data. In some embodiments, the modification criterion can be satisfied if a difference between the second metrology data and a target metrology data for the substrate 202 exceeds a threshold difference. For example, processing logic (e.g., calibration component 152, system controller 228, etc.) can compare the second metrology data with target metrology data associated with substrate process to determine a difference between the second metrology data and the target metrology data. In one illustrative example, the target metrology data corresponds to a reflectance of approximately $R_0$, and therefore a difference between the second metrology data and the target metrology data is approximately 0. Processing logic can determine that the difference between the second metrology data and the target metrology data is approximately 0 and therefore does not satisfy the modification criterion. In response to processing logic determining that the modification criterion is not satisfied, method 400 can proceed to block 418. At block 418, processing logic can proceed with execution of a process recipe associated with substrate 202 and/or the substrate process. For example, the process recipe can include one or more operations to transfer substrate 202 to another station of manufacturing system 200 (e.g., for additional processing) and/or transfer substrate 202 outside of manufacturing system 200. System controller 228 can proceed with execution of the one or more operations of the process recipe.

Figure 5D:
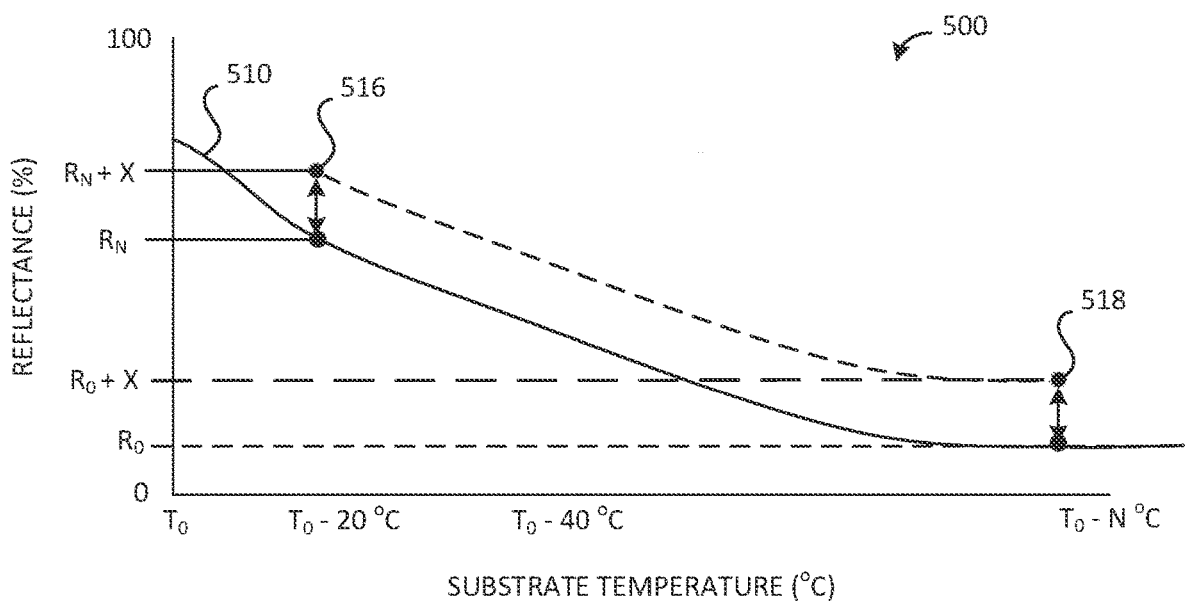

In another illustrative example, processing logic (e.g., calibration component 152, system controller 228) can obtain first metrology data for substrate 202 at or around a high temperature that does not correspond to metrology data for the calibration substrate at or around the high temperature. For example, calibration component 152 can obtain first metrology data 516 associated with substrate 202 at or around temperature $T_0-20°$ C. The spectral data and/or non-spectral data corresponding to first metrology data 516 can indicate that a reflectance associated with the substrate 202 is approximately $R_N+X$, as indicated by FIG. 5D. Calibration component 152 can calculate a calibration factor for substrate 202 based on a difference between the reflectance measured for substrate 202 at or around $T_0-20°$ C. and the reflectance measured for the calibration substrate at or around $T_0-20°$ C. As illustrated in FIG. 5D the difference between the reflectance measured for substrate 202 at or around $T_0-20°$ C. and the reflectance measured for the calibration substrate at or around $T_0-20°$ C. is approximately X units (e.g., $R_N-R_N+X$). Accordingly, calibration component 152 can calculate the calibration factor for substrate 202 to be approximately X units. Calibration component 152 can apply the calculated calibration factor to the reflectance associated with the calibration substrate at or around a lower temperature (e.g., $T_0-N$ ° C.) to determine second metrology data for substrate 202, as described above. As illustrated in FIG. 5D, calibration component 152 can determine that the second metrology data 518 for substrate 202 can correspond to a reflectance of $R_0+X$.

Referring back to FIG. 4, at block 416, processing logic (e.g., calibration component 152, system controller 228, etc.) can determine whether the modification criterion is satisfied in view of the second metrology data 518, as described above. In one example, system controller 228 can determine that a difference between the second metrology data (e.g., $R_0+X$) and the target metrology data (e.g., $R_0$) satisfies the modification criterion (e.g., as the difference of X units exceeds the difference threshold associated with the modification criterion). Responsive to processing logic determining that the modification criterion is satisfied, method 400 can proceed to block 420. At block 420, processing logic modifies the process recipe associated with the substrate. Processing logic can modify the substrate process recipe by causing substrate 202 to be removed from manufacturing system 200 and/or modifying one or more operations associated with the substrate process recipe to be applied to future substrates at the manufacturing system. In an illustrative example, system controller 228 can transmit a signal to one or more components of manufacturing system 200 (e.g., transfer robot 212, factory interface robot 226, etc.) to cause substrate 202 to be removed from manufacturing system 200. System controller 228 can transmit the signals in response to determining that characteristics of substrate 202 do not conform (or approximately conform) to target characteristics of substrate 202, in view of the difference between second metrology data 518 and the target metrology data, in some embodiments.

As indicated above, system controller 228 can modify one or more operations associated with the substrate process recipe that is to be applied to future substrates at the manufacturing system. In an illustrative example, system controller 228 can determine that a thickness of a film deposited on a surface of substrate 202 does not conform to a target film thickness associated with the process recipe. Accordingly, system controller 228 can modify one or more operations of the deposition process to cause one or more components of or connected to process chamber 214, 216, 218 to deposit a film having the target film thickness on a surface of future substrates processed at process chamber 214, 216, 218. System controller 228 can determine the modifications to the one or more operations (e.g., based on a set of rules associated with the substrate process recipe, using one or more machine learning models, etc.), in some embodiments. In additional or alternative embodiments, system controller 228 can transmit a notification to a client device 120 (e.g., via network 130). Information of the notification can be provided to a user (e.g., an operator, a developer, etc.) associated with manufacturing system 200 via a graphical user interface (GUI) of client device 120. For example, information regarding the difference between the second metrology data 518 and the target metrology data can be provided to the user via the GUI. The user can provide an indication of one or more modifications to be applied to the substrate process recipe via the GUI. The client device 120 can transmit a notification including the provided notification to the system controller 228 and the system controller 228 can modify the process recipe in view of the received notification.

It should be noted that in some embodiments, second metrology data can be determined for a substrate 202 based on calibration data obtained from outputs of one or more machine learning models. Further details regarding machine learning techniques are provided with respect to FIGS. 6 and 7.

It should also be noted that although some embodiments of the present disclosure are directed to determining second metrology data for a substrate at low temperature based on first metrology data collected for a substrate at a high temperature, embodiments of the present disclosure can be applied to determining metrology data for a substrate at a high temperature based on metrology data collected for a substrate at a low temperature. For example, calibration component 152 (and/or system controller 228) can generate calibration data based on spectral data and/or non-spectral data collected for a calibration substrate at a low temperature (e.g., below 25° C.) and at a higher temperature (e.g., 25° C.), in accordance with previously described embodiments. In some instances, the spectral data and/or non-spectral data can be collected for the calibration substrate as the calibration substrate warms from the low temperature to the higher temperature. Calibration component 152 can generate a calibration curve based on the collected spectral data and/or non-spectral data, as previously described. During a substrate process, a substrate 202 can be cooled to the low temperature (or around the low temperature). Spectral data and/or non-spectral data can be collected for the substrate 202, in accordance with previously described embodiments. The collected spectral data and/or non-spectral data can correspond to first metrology data for the substrate 202 when the substrate is at or around the low temperature). Calibration component 152 and/or system controller 228 can determine second metrology data for substrate 202 at the higher temperature based on the generated calibration curve, in accordance with previously described embodiments.

It should also be noted that although some embodiments of the present disclosure are directed to metrology data corresponding to a substrate at a first temperature and/or a second temperature, the metrology data can correspond to spectral data and/or non-spectral data when the substrate is at a range of first temperatures and/or a range of second temperatures.

Figure 6:
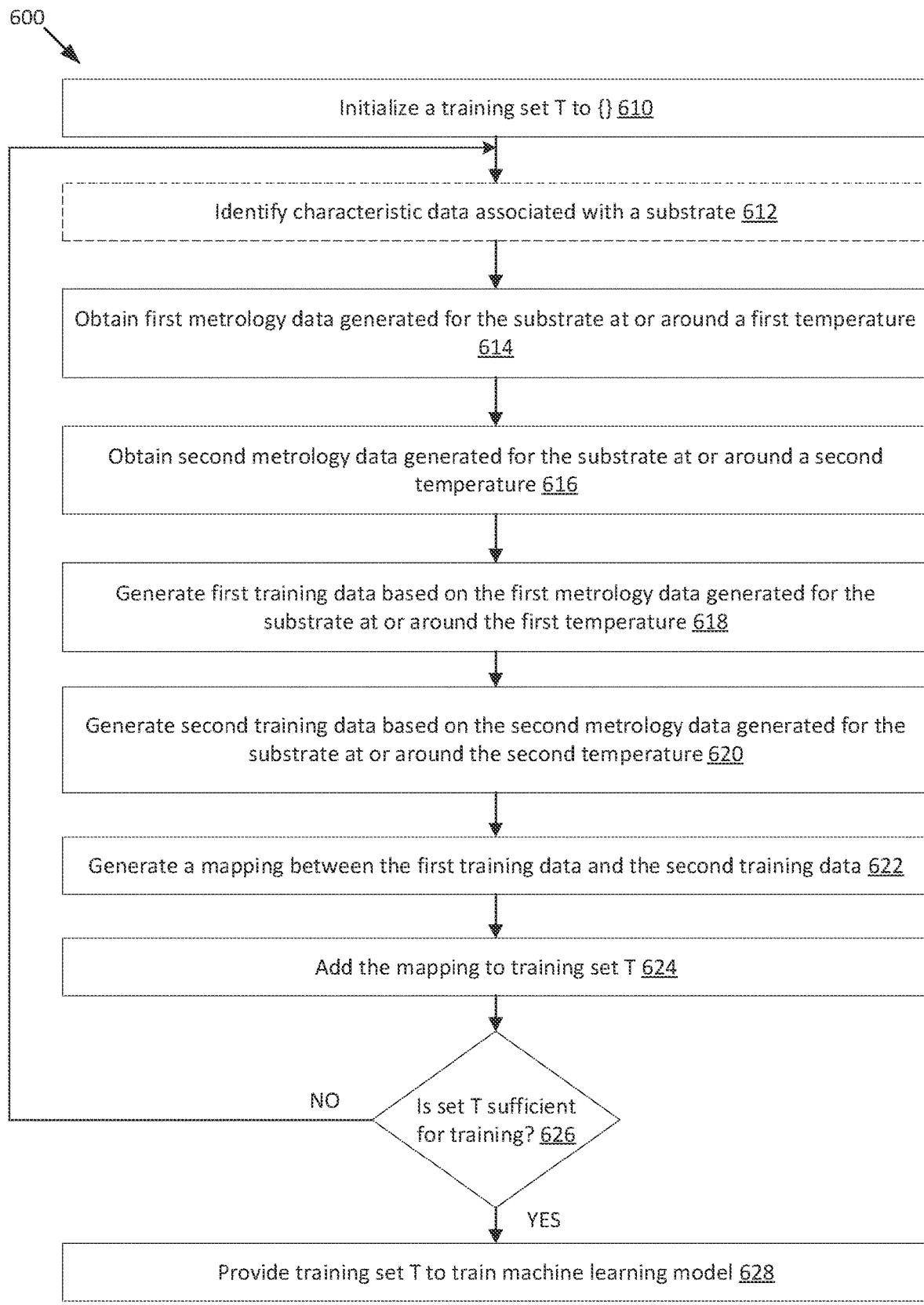
FIG. 6 is a flow chart of a method for training a machine learning model, according to aspects of the present disclosure.

FIG. 6 is a flow chart of a method 600 for training a machine learning model, according to aspects of the present disclosure. Method 600 is performed by processing logic that can include hardware (circuitry, dedicated logic, etc.), software (such as is run on a general purpose computer system or a dedicated machine), firmware, or some combination thereof. In one implementation, method 600 can be performed by one or more components of a system architecture, such as system architecture 100 of FIG. 1. In other or similar implementations, one or more operations of method 600 can be performed by one or more other machines not depicted in the figures. In some aspects, one or more operations of method 600 can be performed by training set generator 172 of predictive system 110. In other or similar aspects, one or more operations of method 600 can be performed by other components of predictive system 110 and/or other components of architecture 100 (e.g., computing system 150, calibration component 152, system controller 228, etc.).

For simplicity of explanation, the methods are depicted and described as a series of acts. However, acts in accordance with this disclosure can occur in various orders and/or concurrently, and with other acts not presented and described herein. Furthermore, not all illustrated acts can be performed to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term article of manufacture, as used herein, is intended to encompass a computer program accessible from any computer-readable device or storage media.

At block 610, processing logic initializes a training set T to an empty set (e.g., { }). At block 612, processing logic, optionally, identifies characteristic data associated with a substrate. In some embodiments, the substrate can be a calibration substrate. As indicated above, a calibration substrate can be a substrate that is manufactured to have particular characteristics (e.g., a particular film thickness, etc.) that can be used to generate data for calibrating other substrates at manufacturing system 200. Data store 140 can store characteristic data associated with the calibration substrate, in accordance with previously described embodiments. For example, data store 140 can store data indicating a thickness of a film deposited on the calibration substrate, one or more materials of the deposited film, and so forth. Processing logic (e.g., training set generator 172) can access data store 140 (e.g., via network 130) can obtain the characteristic data associated with the calibration substrate.

In other or similar embodiments, the substrate 202 can be a substrate that is processed according to a process recipe at process chamber 214, 216, 218 of manufacturing system 200. In such embodiments, data store 140 may not include characteristic data associated with the substrate 202 (e.g., as substrate 202 has not yet been measured by metrology equipment 128 following the substrate process). Accordingly, processing logic may not obtain characteristic data associated with substrate 202, in some embodiments.

At block 614, processing logic can obtain first metrology data generated for the substrate at or around a first temperature. At block 616, processing logic can obtain second metrology data generated for the substrate at or around a second temperature. In some embodiments, the substrate (e.g., the calibration substrate, substrate 202, etc.) can be heated to a high temperature (e.g., 400° C. or higher), as described above. For example, substrate 202 can be heated to the high temperature during a substrate process, as described above. Metrology equipment 128 can collect spectral and/or non-spectral data for the substrate at the high temperature, as described above. System controller 228 (and/or calibration component 152) can determine metrology data associated with the substrate at the high temperature and can store the metrology data at data store 140, in some embodiments. For example, system controller 228 (and/or calibration component 152) can store an indication of the determined metrology data and an indication of the high temperature at data store 140. Metrology equipment 128 can collect spectral data and/or non-spectral data for the calibration substrate at a low temperature (e.g., 25° C.) as described above. For example, metrology equipment 128 can collect spectral data and/or non-spectral data for the calibration substrate as the substrate cools from the high temperature to the low temperature, as described above. System controller 228 (and/or calibration component 152) can determine metrology data associated with the substrate at the low temperature, as described above, and can store the metrology data at data store 140. Processing logic (e.g., training set generator 172) can obtain the first metrology data and/or the second metrology data from data store 140, in some embodiments.

At block 618, processing logic generates first training data based on the first metrology data generated for the substrate at or around the first temperature. In some embodiments, the first training data can include an indication of the first temperature and an indication of the first metrology data (and/or the spectral and/or non-spectral data corresponding to the first metrology data) collected for the substrate. In additional or alternative embodiments, the first training data can include an indication of the characteristic data associated with the substrate (e.g., the calibration substrate). At block 620, processing logic generates second training data based on the second metrology data generated for the substrate at or around the second temperature. In some embodiments, the second training data can include an indication of the second temperature and an indication of the second metrology data (and/or the spectral and/or non-spectral data corresponding to the second metrology data) collected for the substrate. In some embodiments, the second training data can also include an indication of whether the second metrology data corresponds to target metrology data associated with the substrate process. For example, processing logic can compare the second metrology data to target metrology data to determine whether the second metrology data corresponds to (e.g., equals or approximately equals) the target metrology data. Processing logic can generate the second training data to include an indication of whether the second metrology data corresponds to the target metrology data.

At block 622, processing logic generates a first mapping between the first training data and the second training data. At block 624, processing logic adds the mapping to training set T. At block 626, processing logic determines whether the training set, T, includes a sufficient amount of training data to train a machine learning model. It should be noted that in some implementations, the sufficiency of training set T can be determined based simply on the number of mappings in the training set, while in some other implementations, the sufficiency of training set T can be determined based on one or more other criteria (e.g., a measure of diversity of the training examples, etc.) in addition to, or instead of, the number of input/output mappings. Responsive to determining the training set does not include a sufficient amount of training data to train the machine learning model, method 600 returns to block 612. Responsive to determining the training set, T, includes a sufficient amount of training data to train the machine learning model, method 600 continues to block 628.

At block 628, processing logic provides training set T to train the machine learning model. In one implementation, the training set T is provided to training engine 182 of server machine 180 to perform the training. In the case of a neural network, for example, input values of a given input/output mapping are input to the neural network, and output values of the input/output mapping are stored in the output nodes of the neural network. The connection weights in the neural network are then adjusted in accordance with a learning algorithm (e.g., backpropagation, etc.), and the procedure is repeated for the other input/output mappings in the training set T. After block 628, machine learning model 190 can be used to predict metrology data for a substrate at a particular temperature and/or a target temperature (e.g., 25° C., or another temperature) based on metrology data associated with the substrate at a different temperature (e.g., a higher temperature, a lower temperature), in accordance with embodiments described with respect to FIG. 7.

Figure 7:
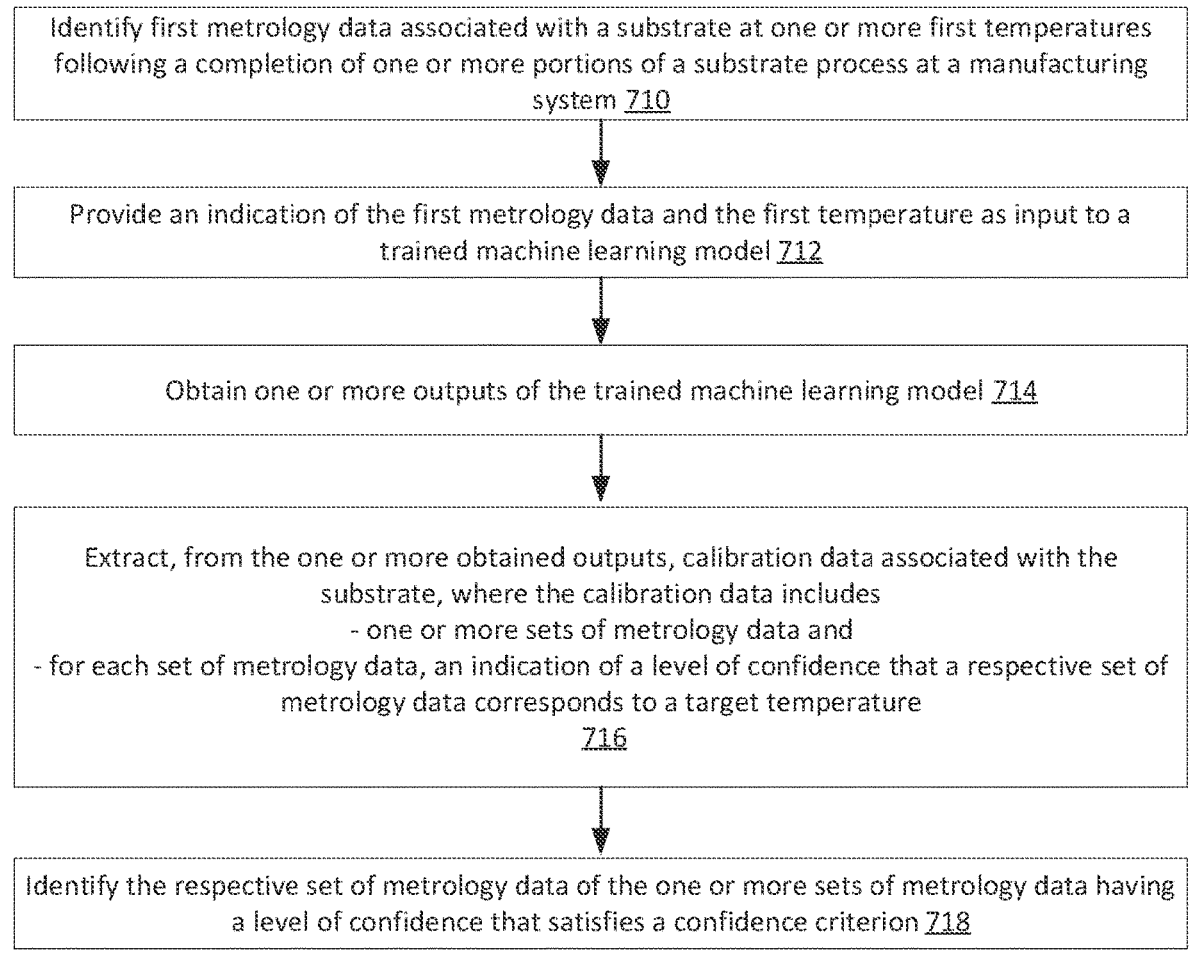
FIG. 7 is a flow chart of a method of temperature-based metrology calibration using machine learning, according to aspects of the present disclosure.

FIG. 7 is a flow chart of a method 700 of temperature-based metrology calibration using machine learning, according to aspects of the present disclosure. Method 700 is performed by processing logic that can include hardware (circuitry, dedicated logic, etc.), software (such as is run on a general purpose computer system or a dedicated machine), firmware, or some combination thereof. In one implementation, method 700 can be performed by one or more components of a system architecture, such as system architecture 100 of FIG. 1. In other or similar implementations, one or more operations of method 700 can be performed by one or more other machines not depicted in the figures. In some aspects, one or more operations of method 700 can be performed by predictive component 114 of predictive system 110 and/or computing system 150. In other or similar aspects, one or more operations of method 700 can be performed by other components of predictive system 110 and/or other components of architecture 100 (e.g., computing system 150, calibration component 152, system controller 228, etc.).

For simplicity of explanation, the methods are depicted and described as a series of acts. However, acts in accordance with this disclosure can occur in various orders and/or concurrently, and with other acts not presented and described herein. Furthermore, not all illustrated acts can be performed to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term article of manufacture, as used herein, is intended to encompass a computer program accessible from any computer-readable device or storage media.

At block 710, processing logic identifies first metrology data associated with a substrate at one or more first temperatures following a completion of one or more portions of a substrate process at a manufacturing system. As described above, system controller 228 and/or calibration component 152 can obtain spectral data and/or non-spectral data associated with a substrate 202 that is at or around a first temperature following a substrate process. In some embodiments, the spectral data and/or non-spectral data can be collected for substrate 202 while substrate is at a range of temperatures (e.g., from the first temperature to another temperature that is slightly cooler or warmer than the first temperature). System controller 228 and/or calibration component 152 can determine first metrology data for the substrate 202 based on the obtained spectral data and/or non-spectral data, in accordance with previously described embodiments. In some embodiments, system controller 228 and/or calibration component 152 can provide the first metrology data to predictive component 114 (e.g., via network 130, via a bus or other type of interface at computing system 150, etc.). In other or similar embodiments, system controller 228 and/or calibration component 152 can store the first metrology data (e.g., with an indication of the first temperature) at data store 140, as described above. Predictive component 114 can identify the first metrology data at data store 140.

At block 712, processing logic provides an indication of the first metrology data and the one or more first temperatures as input to a trained machine learning model (e.g., machine learning model 190). The machine learning model can be trained to predict metrology data for a substrate at a particular temperature and/or a target temperature (e.g., 25° C., or another temperature) based on metrology data associated with the substrate at a different temperature (e.g., a higher temperature, a lower temperature). In some embodiments, the machine learning model can be trained by training set generator and/or training engine 182, in accordance with embodiments described with respect to FIG. 6.

At block 714, processing logic can obtain one or more outputs of the trained machine learning model. At block 716, processing logic can extract, from the one or more obtained outputs, calibration data associated with the substrate, wherein the calibration data includes one or more sets of metrology data and, for each set of metrology data, an indication of a level of confidence that a respective set of metrology data corresponds to a target temperature. At block 718, processing logic can identify the respective set of metrology data of the one or more sets of metrology data having a level of confidence that satisfies a confidence criterion. In some embodiments, a level of confidence can satisfy a confidence criterion by meeting a threshold level of confidence and/or being larger than the other levels of confidence associated with the one or more sets of metrology data.

The identified set of metrology data can correspond to second metrology data that is expected for the substrate at the particular and/or target temperature following the completion of the one or more portions of the process. Predictive component 114 can provide an indication of the second metrology data to system controller 228 and/or calibration component 152 (e.g., via network 130, via a bus or other interface of computing system 150, etc.). In response to receiving the second metrology data, system controller 228 and/or calibration component 152 can determine whether a modification criterion is satisfied in view of the second metrology data, as described above. System controller 228 can modify one or more operations of a process recipe associated with the substrate process in response to determining that the modification criterion is satisfied, in accordance with previously described embodiments.

Figure 8:
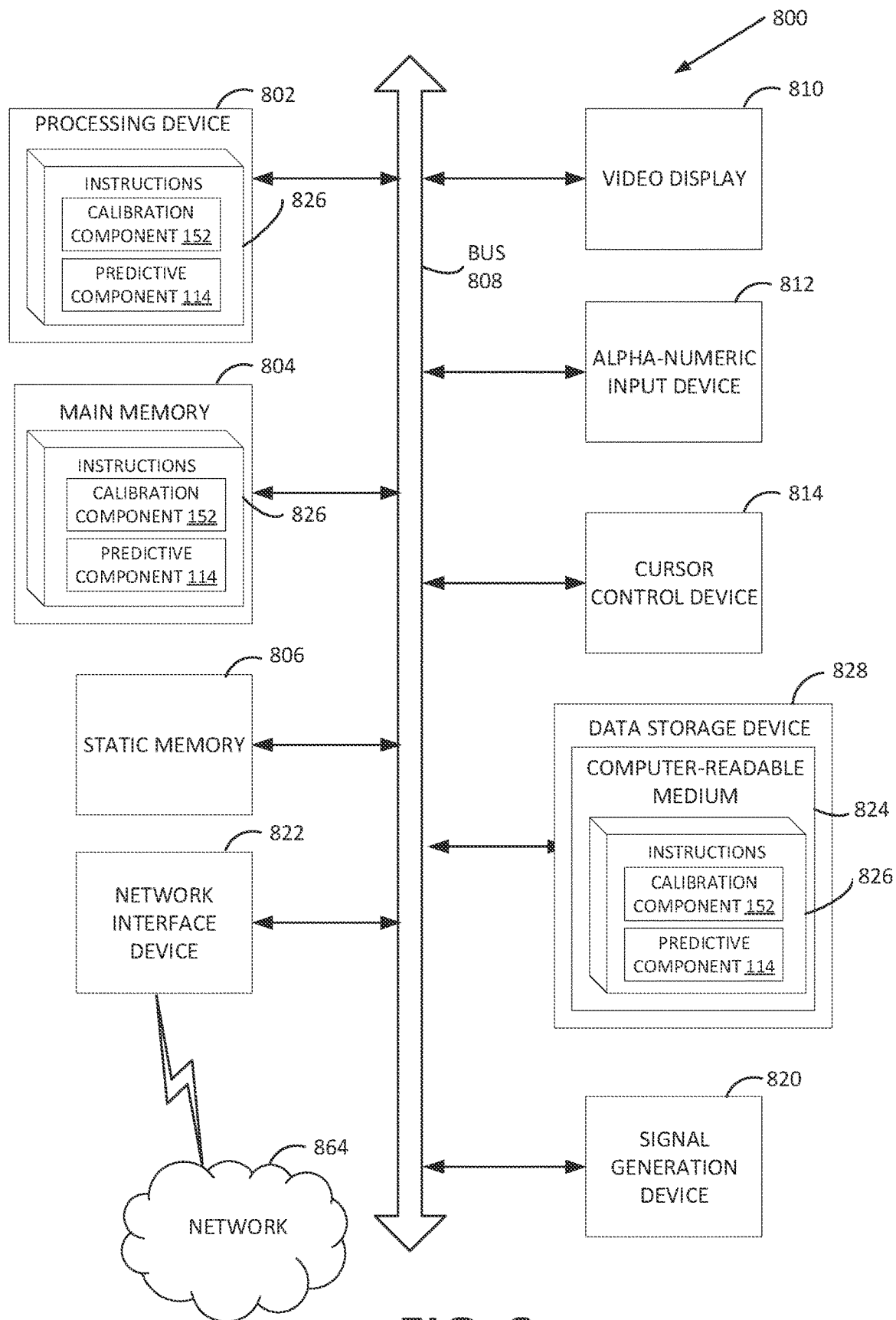
FIG. 8 depicts a block diagram of an illustrative computer system operating in accordance with one or more aspects of the present disclosure.

FIG. 8 depicts a block diagram of an illustrative computer system 800 operating in accordance with one or more aspects of the present disclosure. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet computer, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. In embodiments, computing device 800 may correspond to predictive server 112 and/or computing system 150 of FIG. 1, system controller 228 of FIG. 2, and/or another processing device of manufacturing system 100.

The example computing device 800 includes a processing device 802, a main memory 804 (e.g., read-only memory (ROM), flash memory, dynamic random access memory (DRAM) such as synchronous DRAM (SDRAM), etc.), a static memory 806 (e.g., flash memory, static random access memory (SRAM), etc.), and a secondary memory (e.g., a data storage device 828), which communicate with each other via a bus 808.

Processing device 802 may represent one or more general-purpose processors such as a microprocessor, central processing unit, or the like. More particularly, the processing device 802 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. Processing device 802 may also be or include a system on a chip (SoC), programmable logic controller (PLC), or other type of processing device. Processing device 802 is configured to execute the processing logic for performing operations and steps discussed herein.

The computing device 800 may further include a network interface device 822 for communicating with a network 864. The computing device 800 also may include a video display unit 810 (e.g., a liquid crystal display (LCD) or a cathode ray tube (CRT)), an alphanumeric input device 812 (e.g., a keyboard), a cursor control device 814 (e.g., a mouse), and a signal generation device 820 (e.g., a speaker).

The data storage device 828 may include a machine-readable storage medium (or more specifically a non-transitory computer-readable storage medium) 824 on which is stored one or more sets of instructions 826 embodying any one or more of the methodologies or functions described herein. Wherein a non-transitory storage medium refers to a storage medium other than a carrier wave. The instructions 826 may also reside, completely or at least partially, within the main memory 804 and/or within the processing device 802 during execution thereof by the computer device 800, the main memory 804 and the processing device 802 also constituting computer-readable storage media.

The computer-readable storage medium 824 may also be used to store model 190 and data used to train model 190. The computer readable storage medium 824 may also store a software library containing methods that call model 190. While the computer-readable storage medium 824 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing or encoding a set of instructions for execution by the machine and that cause the machine to perform any one or more of the methodologies of the present disclosure. The term "computer-readable storage medium" shall accordingly be taken to include, but not be limited to, solid-state memories, and optical and magnetic media.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method may be altered so that certain operations may be performed in an inverse order so that certain operations may be performed, at least in part, concurrently with other operations. In another embodiment, instructions or sub-operations of distinct operations may be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
   obtaining, by a set of one or more processing devices, first metrology data representing one or more features of a substrate, wherein the substrate is at a first temperature following a completion of a substrate process at a manufacturing system;

determining, by the set of one or more processing devices and in view of calibration data associated with the substrate, second metrology data representing the one or more features of the substrate at a second temperature, wherein the second temperature is different from the first temperature; and responsive to determining, in view of the second metrology data, that a modification criterion associated with the substrate process is satisfied, modifying, by the set of one or more processing devices, a substrate process recipe associated with the substrate process.

2. The method of claim 1, wherein determining, in view of the calibration data associated with the substrate, the second metrology data corresponding to the second temperature associated with the substrate comprises:

obtaining the calibration data associated with the substrate process, wherein the calibration data comprises first prior metrology data collected for a calibration substrate at a first prior temperature, and second prior metrology data collected for the calibration substrate at a second prior temperature;

calculating a calibration factor associated with the substrate based on the calibration data, the first temperature, and the first metrology data associated with the substrate; and applying the calibration factor to the first metrology data to determine the second metrology data.

3. The method of claim 2, wherein obtaining the calibration data associated with the substrate process comprises:

causing a calibration substrate to be heated to the first prior temperature;

collecting first prior spectral data and second prior spectral data associated with the calibration substrate as a temperature of the calibration substrate changes from the first prior temperature to the second prior temperature; and determining the first prior metrology data based on the first prior spectral data and the second prior metrology data based on the second prior spectral data.

4. The method of claim 3, further comprising:

generating a calibration curve based on the first prior metrology data and the second prior metrology data, wherein the calibration factor is calculated in view of the generated calibration curve.

5. The method of claim 1, wherein the first metrology data and the second metrology data correspond to at least one of reflectivity data, ellipsometry data, or x-ray data.

6. The method of claim 1, wherein the substrate process corresponds to at least one of a deposition process or an etching process.

7. The method of claim 1, wherein modifying the substrate process recipe comprises at least one of:

causing the substrate to be removed from the manufacturing system, or modifying one or more operations associated with the substrate process recipe to be applied to future substrates at the manufacturing system.

8. A non-transitory computer readable medium comprising instructions that, when executed by a processing device, cause the processing device to:

obtain first metrology data representing one or more features of a substrate, wherein the substrate is at a first temperature following a completion of a substrate process at a manufacturing system;

determine, in view of calibration data associated with the substrate, second metrology data representing the one or more features of the substrate at a second temperature, wherein the second temperature is different from the first temperature; and responsive to determining, in view of the second metrology data, that a modification criterion associated with the substrate process is satisfied, modify a substrate process recipe associated with the substrate process.

9. The non-transitory computer readable medium of claim 8, wherein to determine, in view of the calibration data associated with the substrate, the second metrology data corresponding to the second temperature associated with the substrate, the processing device is to:

obtain the calibration data associated with the substrate process, wherein the calibration data comprises first prior metrology data collected for a calibration substrate at a first prior temperature and second prior metrology data collected for the calibration substrate at a second prior temperature;

calculate a calibration factor associated with the substrate based on the calibration data, the first temperature, and the first metrology data associated with the substrate; and apply the calibration factor to the first metrology data to determine the second metrology data.

10. The non-transitory computer readable medium of claim 9, wherein to obtain the calibration data associated with the substrate process, the processing device is to:

cause a calibration substrate to be heated to the first prior temperature;

collect first prior spectral data and second prior spectral data associated with the calibration substrate as a temperature of the calibration substrate changes from the first prior temperature to the second prior temperature; and determine the first prior metrology data based on the first prior spectral data and the second prior metrology data based on the second prior spectral data.

11. The non-transitory computer readable medium of claim 10, wherein the processing device is further to:

generate a calibration curve based on the first prior metrology data and the second prior metrology data, wherein the calibration factor is calculated in view of the generated calibration curve.

12. The non-transitory computer readable medium of claim 8, wherein the first metrology data and the second metrology data correspond to at least one of reflectivity data, ellipsometry data, or x-ray data.

13. The non-transitory computer readable medium of claim 8, wherein the substrate process corresponds to at least one of a deposition process or an etching process.

14. The non-transitory computer readable medium of claim 8, modifying the substrate process recipe comprises at least one of:

causing the substrate to be removed from the manufacturing system, or modifying one or more operations associated with the substrate process recipe to be applied to future substrates at the manufacturing system.

* * * * *